United States Patent
Schmitt et al.

(10) Patent No.: US 9,856,577 B2
(45) Date of Patent: Jan. 2, 2018

(54) BULK DIFFUSION CRYSTAL GROWTH OF NITRIDE CRYSTAL

(71) Applicant: Nitride Solutions, Inc., Wichita, KS (US)

(72) Inventors: Jason Schmitt, Wichita, KS (US); Peng Lu, Wichita, KS (US); Jeremy Jones, Wichita, KS (US)

(73) Assignee: Nitride Solutions, Inc., Wichita, KS (US)

(*) Notice: Subject to any disclaimer, the term of this patent is extended or adjusted under 35 U.S.C. 154(b) by 413 days.

(21) Appl. No.: 14/477,431

(22) Filed: Sep. 4, 2014

(65) Prior Publication Data

US 2015/0059641 A1     Mar. 5, 2015

Related U.S. Application Data

(60) Provisional application No. 61/873,729, filed on Sep. 4, 2013.

(51) Int. Cl.
| | |
|---|---|
| *C30B 1/02* | (2006.01) |
| *C30B 23/00* | (2006.01) |
| *C30B 29/40* | (2006.01) |
| *C30B 25/00* | (2006.01) |

(52) U.S. Cl.
CPC ............ *C30B 23/005* (2013.01); *C30B 25/00* (2013.01); *C30B 29/403* (2013.01)

(58) Field of Classification Search
CPC .. C30B 1/00; C30B 1/02; C30B 1/026; C30B 1/04; C30B 1/10; C30B 23/00; C30B 23/002; C30B 23/005; C30B 23/02; C30B 23/06; C30B 25/00; C30B 25/02; C30B 25/10; C30B 25/12; C30B 25/18; C30B 29/00; C30B 29/10; C30B 29/38; C30B 33/00; C30B 33/02
USPC ....... 117/2-4, 7, 9-10, 84, 88, 94, 101-102, 117/106, 902, 937, 952
See application file for complete search history.

(56) References Cited

U.S. PATENT DOCUMENTS

| | | |
|---|---|---|
| 3,024,965 A | 3/1962 | Milleron |
| 3,954,416 A | 5/1976 | Keller |
| 4,052,538 A | 10/1977 | Eddy et al. |
| 4,193,954 A | 3/1980 | Speronello |
| 4,650,541 A | 3/1987 | Ciszek |
| 4,762,576 A | 8/1988 | Wilson et al. |
| 4,895,765 A | 1/1990 | Sue et al. |

(Continued)

FOREIGN PATENT DOCUMENTS

| | | |
|---|---|---|
| DE | 198 41 012 C1 | 1/2000 |
| WO | 2010 069594 A1 | 6/2010 |
| WO | 2013 045596 A2 | 4/2013 |

OTHER PUBLICATIONS

PCT/US14/54071 International Search Report and Written Opinion dated Dec. 12, 2014 (13 pages).

(Continued)

*Primary Examiner* — Kenneth A Bratland, Jr.
(74) *Attorney, Agent, or Firm* — Polsinelli PC

(57) ABSTRACT

The present disclosure generally relates to systems and methods for growing group III-V nitride crystals. In particular the systems and methods include diffusing constituent species of the crystals through a porous body composed of the constituent species, where the species freely nucleate to grow large nitride crystals.

20 Claims, 17 Drawing Sheets

(56) References Cited

U.S. PATENT DOCUMENTS

| | | | |
|---|---|---|---|
| 5,096,860 | A | 3/1992 | Nadkarni |
| 5,114,695 | A | 5/1992 | Jain et al. |
| 5,356,579 | A | 10/1994 | Jennings et al. |
| 5,463,977 | A | 11/1995 | Manada et al. |
| 5,633,192 | A | 5/1997 | Moustakas et al. |
| 5,710,382 | A | 1/1998 | Dunmead et al. |
| 6,013,130 | A | 1/2000 | Dieter et al. |
| 6,015,517 | A | 1/2000 | Casey |
| 6,066,290 | A | 5/2000 | Dennis et al. |
| 6,110,279 | A | 8/2000 | Kito et al. |
| 7,494,546 | B1 | 2/2009 | Vispute et al. |
| 8,123,859 | B2 | 2/2012 | Schowalter et al. |
| 8,399,367 | B2 | 3/2013 | Schmitt |
| 2003/0234176 | A1 | 12/2003 | Haidar |
| 2005/0229856 | A1 | 10/2005 | Malik |
| 2007/0257334 | A1 | 11/2007 | Leibiger et al. |
| 2008/0026591 | A1* | 1/2008 | Kordina ............ C23C 16/45519 438/758 |
| 2008/0072817 | A1 | 3/2008 | Zwieback et al. |
| 2008/0081013 | A1 | 4/2008 | Fudada et al. |
| 2008/0193363 | A1 | 8/2008 | Tsuji |
| 2009/0081857 | A1 | 3/2009 | Hanser et al. |
| 2010/0147211 | A1* | 6/2010 | Miyanaga ............ C30B 29/403 117/84 |
| 2011/0008621 | A1 | 1/2011 | Schujman et al. |
| 2011/0011332 | A1* | 1/2011 | Schowalter ........... C30B 11/003 117/88 |
| 2011/0129669 | A1 | 6/2011 | Fujito et al. |
| 2011/0303931 | A1 | 12/2011 | Kang et al. |
| 2012/0280249 | A1 | 11/2012 | Arena |
| 2013/0000552 | A1 | 1/2013 | Schmitt |
| 2013/0004375 | A1 | 1/2013 | Schmitt |

OTHER PUBLICATIONS

PCT/EP2012/069156 International Search Report published as WO 2013.045596 A3 (7 pages).
PCT/US12/44677 International Search Report and Written Opinion dated Sep. 10, 2012 (9 pages).
PCT/US12/44677 International Search Report published as WO 2013/003609A1 published Jan. 3, 2013 (45 pages).
U.S. Appl. No. 13/171,200 Office Action dated Nov. 30, 2011 (19 pages).
U.S. Appl. No. 13/171,200 Office Action dated Nov. 10, 2014 (14 pages).
U.S. Appl. No. 13/171,200 Office Action dated Sep. 6, 2013 (31 pages).
U.S. Appl. No. 13/844,182 Office Action dated Dec. 29, 2014 (16 pages).
Bardos; "Radio Frequency Hollow Cathodes for the Plasma Processing Technology"; Surface and Coating Technology, Elsevier Amsterdam, NL.: vol. 86-87; Dec. 1, 1996; pp. 648-656.
PCT/US14/59773 International Search Report and Written Opinion dated Dec. 19, 2014 (11 pages).
CRC Handbook of Chemistry and Physics; 92nd Edition; pp. 4-121 to 4-123; and p. 4-127 (2011-2012); (4 pages).
Epelbaum, B.M., et al., "Natural growth habit of bulk AlN crystals," Journal of Crystal Growth, Elsevier, Amsterdam, NL, vol. 265, No. 3-4, May 1, 2004, pp. 577-581.
European Search Report for EP Application No. 14844684.2 dated Mar. 24, 2017, nine pages.

* cited by examiner

BULK DIFFUSION CRYSTAL GROWTH OF NITRIDE CRYSTAL

RELATED APPLICATIONS

The application claims priority to U.S. Provisional Application No. 61/873,729, entitled "Bulk Diffusion Crystal Growth Process," filed on Sep. 4, 2013; which is incorporated herein by reference in its entirety.

FEDERALLY SPONSORED RESEARCH OR DEVELOPMENT

N/A

FIELD OF INVENTION

The present invention relates to the field of nitride semiconductor crystal substrates that can be used in the fabrication of larger nitride semiconductor crystal or electronic and or piezoelectric devices.

BACKGROUND OF THE INVENTION

Growth of single crystal gallium nitride (GaN), aluminum nitride (AlN), and aluminum gallium nitride (AlGaN) is notoriously hard due to a lack of good "freely nucleated" seed crystals. As of currently there is no good process to produce freely nucleated III-nitrides usable for seeds or for electronic, optic, piezoelectric, and Pyroelectronic device substrates.

Fabrication of silicon carbide (SiC), GaN and AlN crystals using the sublimation method invented by Tairov and Tsvetkov in 1978 and Slack and McNelly in 1976 respectively is well known. In this method a powder sources is placed at the bottom of a closed crucible and sublimated into vapor. The vapor is transported through the empty space of the closed crucible via a temperature gradient to a seed held at a lower temperature, where the sublimated species recrystallize on a provide seed crystal.

This technique has proven sufficient for the growth of large single crystals of SiC, where diameters up to 6 inches have been readily demonstrated. But this technique has been lacking in its ability to deliver the same results for Group III-V nitride crystals, such as AlN and GaN. The fabrication of large AlN crystals with low induced internal stress of high quality has proven quite difficult. Obstacles related to available materials have been identified as a major obstacle in the growth of high-purity, large-size AlN crystals. For example, sublimation temperatures in excess of 2200° C. are required to achieve commercially viable AlN growth rates. At these temperatures, aluminum (Al) vapor is highly reactive with all but the most robust materials. A lack of large size seeds also lends to the use of thermal grain expiation via bowed thermal fields. Typically, the bowed thermal fields used to expand the size of the AlN seed crystals to produce bulk AlN induce stress into the crystals. This stress is transferred throughout the bulk of the produced AlN. Large Area SiC crystals up to 4 inches in diameter have been used to compensate for the lack of large size AlN seeds but often with disappointing results. AlN growth on SiC leads to highly order polycrystalline material where large grains are orientated in the z axis perpendicular to the SiC crystal surface but are tilted or at low-angle mismatch in the x-y plane.

Many attempts have been made to find a suitable method to adapt sublimation growth to GaN. The problem in GaN sublimation growth is due to the low transport of Gallium (Ga) vapor at the GaN sublimation temperatures. The vapor pressure of Ga over GaN at typical sublimation temperatures gives rise to nitrogen evolution without Ga evolution. Furthermore the nitrogen is far from active at these low temperatures. Active NH3 can be used to enhance the system but at a shift to higher nitrogen partial pressures. Thus usually lower temperatures are used. This in turn increases the problem with the Ga species. At lower temperatures, the surface mobility of Ga adatoms is limited and thus so are crystal growth rates. Sufficient Ga flux can be achieved by using extreme temperature gradients typically found in closed space sublimation. The extreme temperature gradients increase Ga transport and thus crystal growth speed but at the expense of crystal quality. Even with an optimized transport regime, large high quality seeds for both AlN and GaN growth have been difficult to produce. For the foregoing reasons, there is a need for a process that can produce "freely nucleated" high quality GaN AlN and Aluminum GaN crystals that can act as seeds and/or as device substrates.

SUMMARY OF THE INVENTION

The present disclosure generally relates to methods and processes for producing large high quality Group III-V seed crystals. Although described with reference to AlN and GaN, other group III nitrides, such as AlGaN, among others, may be produced. The present disclosure also relates to systems, devices, compositions of matter, and articles of manufacture produced by the methods disclosed herein.

In one aspect, a method of growing group III-V nitride crystal comprises diffusing at least one of a group-III or a nitrogen species through a porous body.

The method may further include growing a substantially single crystal. The group III-V nitride crystal may comprise nitrogen and at least one species of Al, Ga, and In. In one aspect, the group III-V nitride crystal has a formula of $Al_xIn_yGa_{(1-x-y)}N$, where $0 \geq x \leq 1$, $0 \geq y \leq 1$, $x+y+(1-x-y) \neq 1$. In another aspect, the porous body comprises at least one of AlN, $Al1Ga(1-x)N$, $Al1In(1-x)N$ where ($0 \geq x \leq 1$), $Al_xIn_yGa(1-x-y)N$ or a combination thereof.

The porous body may further include a filler composed of at least one refractory material, such as at least one carbide of silicon, niobium, tantalum, zirconium, tungsten, titanium, vanadium, nickel, chromium, molybdenum, rhenium, or hafnium. The filler may include at least one species of Ga, In, Zr, Zn, or Mg. or a complex ceramic material, such as Al—TiB2, BN—TiB2, or AlN—TiB2.

In other aspects, the porous body is a solid porous material that comprises at least one of a sintered ceramic powder, a refractory metal baffle, a refractory metal mesh, a metal foam or a ceramic foam. The porous body may also be Polycrystalline These and other features, aspects, and advantages of the present invention will become better understood with reference to the following description and claim

BRIEF DESCRIPTION OF THE DRAWING

Corresponding reference characters indicate corresponding elements among the various views of the drawings. The headings used in the figures should not be interpreted to limit the scope of the claims

DETAILED DESCRIPTION

Figure 1:
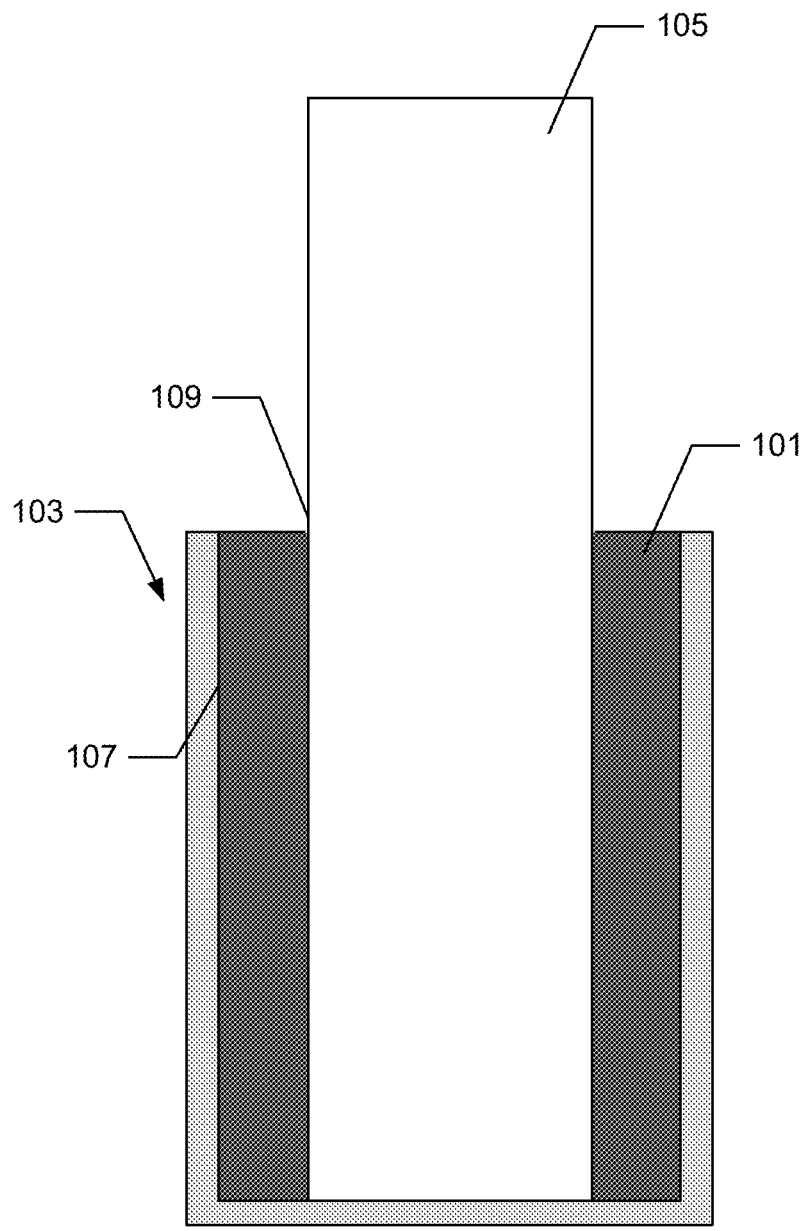
FIG. 1 is a cross-sectional view of a crucible packed with a charge and packing tube according to one embodiment.

The present disclosure generally relates to methods and processes for producing large high quality Group III-V crystals. These crystals may be used for any suitable purpose, including but limited to use as seed crystals, bulk crystals, stand-alone crystals, or crystals suitable for use in devices. Although described with reference to aluminum nitride (AlN) and gallium nitride (GaN), other group III nitrides, including but not limited to aluminum gallium nitride (AlGaN), may be produced. The present disclosure also relates to systems, devices, compositions of matter, and articles of manufacture produced by the methods disclosed herein.

The various embodiments of the methods disclosed herein expressly address a number of common problems observed in other bulk crystal growth processes. These problems include an excessive number of initial nucleation sites, the inability to preferably select where the crystal nucleation will occur, the inability to control the orientation that crystal nucleation occurs. All of which give rise to issues with crystals growing into each other. For example, if the nucleation sights are too tightly packed or too numerous, the crystal size will be truncated due to crystal collision where two, or more, crystals collide and grow into a single crystal with two or more distinct grain boundaries. In contrast, the systems and methods of the present disclosure ensure larger surface area crystals with controllable preferential crystallographic orientations are produced.

In various aspects, the disclosed method is both a sublimation and bulk diffusion process. By way of example and not limitation, various embodiments of the present disclosure include the steps of disposing a charge within an open-top vessel or crucible. As used herein, a charge refers to the source for the crystal that includes one or more constituents of the crystals to be grown. In various aspects, the charge includes at least one constituent species, preferably a metal species (e.g. AlN), of the desired crystals. A cavity, such as but not limited to a lumen, is formed with in the charge to form a hollow structure. The resulting interior space is the area in which the crystals will grow.

By radially heating the outside of the crucible, a temperature gradient is formed from the outside of crucible through the bulk of the charge. The resulting thermal profile provides a hotter, sublimation area on the exterior of the charge and cooler recrystallization area on the interior wall of the charge. Diffusion thus becomes a transport mechanism for the Al vapors to migrate into the cooler region where crystallization occurs.

In various aspects, the hotter exterior (or non-growth) surface of a compacted AlN charge provides the Al and or the Al & nitrogen (N) species which are then diffused through the progressively cooler interior bulk of the charge due to a formed thermal gradient. The systems and method disclosed herein may use tubular charge shapes, with varying cylindrical and/or elliptical offset spacing to the center of the charge to provide temperature gradients. In some aspects, the charge is a slab or any other two-dimensional or three-dimensional shape having two or more surfaces.

In one aspect, the diffusion path length is dependent on the final or initial growth rates and quality of the crystal. Additionally, the bulk charge particle size and dependence to Al diffusion path length/final or initial growth rate and quality of the crystal has been undertaken.

Particle size and packing density affects the initial nucleation and subsequent growth of AlN crystals. This is accomplished via particle manipulation/control such as full charge replacement, multiple charge layers with differencing particle size or particle layer segregation where only a small part of the layer is replaced with differencing particle size AlN charge.

The disclosed systems and methods can use pure magnesium (Mg), Al, indium (In) and Ga metals, among others as an oxygen getter, thus removing oxygen contamination from the AlN charge at temperatures in a range between about 1100-1950° C. In some aspects, Al can be used as a supplementary source of Al vapor in the charge. Moreover, Al may have a dual purpose as part of the charge. First its role is to offer a larger Al concentration then that typically found in pure AlN sublimation, as the vapor pressure of Al(g) over Al(l) is an order of magnitude larger then Al(g) over AlN(s). Secondly, it acts a nucleation suppressant. The addition of Al metal with the AlN source was shown to dramatically reduce both the number of initial nucleation sites and the oxygen concentration of the resulting AlN crystals. In the charge, Al metal is added as either a powder or solid source such as a wire, rod, or pellet and mixed before the filling of the crucible or as a wire that is coiled in as the charged is filling the crucible. AlCl and AlCl$_3$ can also be used as a supplementary source of Al vapor or as the sole source of Al when using a non-AlN porous body or using an AlN body at low temperature below about 1900° C.

In various aspects, the group III-V nitride crystals grown using the systems and methods of the present disclosure may include nitrogen and at least one species of Al, Ga, and In. In another aspect, the group III-V nitride crystals may have a formula of $Al_xIn_yGa_{(1-x-y)}N$, where $0 \geq x \leq 1$, $0 \geq y \leq 1$, $x+y+(1-x-y) \neq 1$. In another aspect, the porous body includes at least one of AlN, $Al_1Ga_{(1-x)}N$, $Al_1In_{(1-x)}N$ where $(0 \geq x \leq 1)$, $Al_xIn_yGa_{(1-x-y)}N$ or a combination thereof.

In other aspects, a filler material is incorporated into the growth process. The filler material may include a refractory material, such as carbides of silicon, niobium, tantalum, zirconium, tungsten, titanium, vanadium, nickel, chromium, molybdenum, rhenium, or hafnium. The filler may include at least one species of Ga, In, zirconium (Zr), zinc (Zn), or Mg. The filler may also include a complex ceramic material, including but not limited to such as aluminum-titanium diboride ($Al-TiB_2$), boron nitride/titanium diboride ($BN-TiB_2$), or aluminum nitride/titanium diboride ($AlN-TiB_2$).

Growth of AlN Crystals

Figure 2:
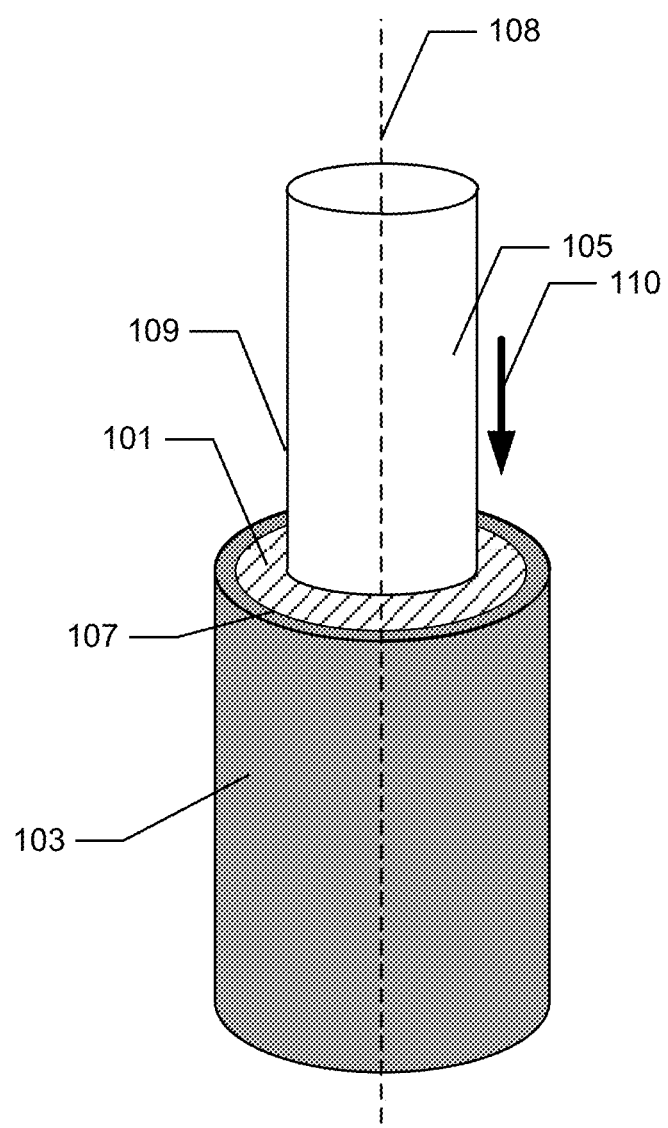
FIG. 2 is a cross-sectional view of a crucible packed with a charge and a packing tube according to one embodiment.
Figure 3:
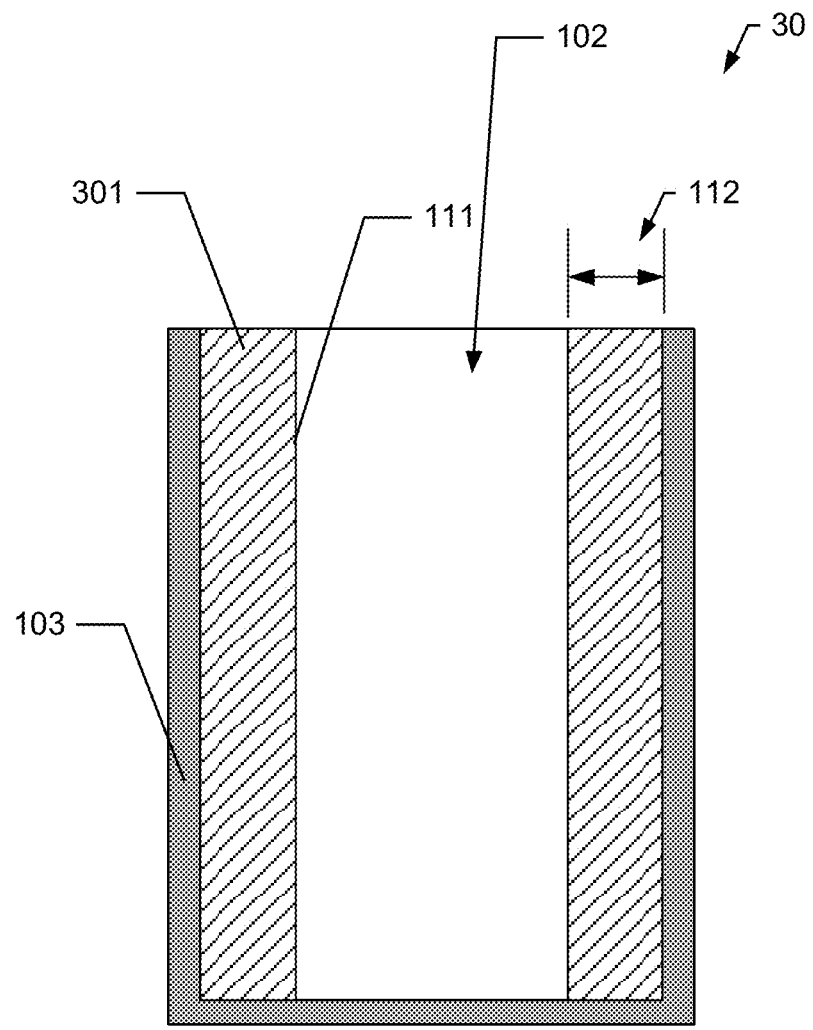
FIG. 3 is a cross-sectional view of a crucible and a charge body disposed therein, according to one embodiment.

Referring now to FIGS. 1-3, a crucible 103 suitable for use within a high-temperature reactor is filled with a charge 101. The charge 101 is typically a solid that is disposed within the crucible and forming a porous body. In one embodiment, the charge 101 is composed of AlN (AlN) powder. The particle size of a powder charge 101 may be in a range between 0.01 microns and 10 mm. In one embodiment, the particle size of the charge 101 may be uniform, alternately in another embodiment the particle size may vary such that the charge is composed of a distribution of different size particles. In one embodiment, the charge 101 is composed of AlN powder having a distribution of particles in a range between 0.1 microns to 1 mm.

As shown in FIG. 3, a cavity 102 is formed with in the charge 101 by an elongated structure, such as an internal packing tube 105. In one aspect, the packing tube 105 is positioned within the crucible 103 prior to the addition the charge, while in another aspect; the packing tube is used to bore through the charge previously deposited in the crucible. While the packing tube 105 is disposed within the charge 101, the charge is compressed to form a porous charge body 301 that will retain its structure after removal of the packing tube 105. In one embodiment, the charge 101 is compressed linearly downward along an axis parallel to a central axis 108 of the crucible, as generally indicated by 110. In another embodiment, the charge 101 is compressed outward radially. This may be accomplished by manipulation of the packing tube 105. In other embodiments, the charge 101 may be compacted by a combination of linear and radial forces. The amount for force necessary to compress the charge 101 is dependent, at least in part, upon the particle size composition of the charge and may vary between embodiments.

By way of example and not limitation, in one particular embodiment, approximately 1.5 kg of AlN powder charge 101 is loaded inside a hollow crucible 103 having an internal diameter of approximately 6 inches about an internal packing tube 105 having a diameter of approximately 3 inches. The packing tube 105 is positioned within the crucible along a central longitudinal axis 108 of within the crucible, as shown in FIG. 2.

The charge 101 is compressed between the interior wall 107 of the crucible 103 and the external surface 109 of the packing tube 105. The powder charge 101 is pressed, at least a sufficient amount, for the charge to retain its shape and define the cavity 102, after the internal packing tube 105 is removed. The result is a charge body 301 having internal surfaces 111 that define the internal cavity 102. In other embodiments, other combinations of the diameters for the crucible 103 and the packing tube 105 may be used to create charge bodies of any desired thickness 112.

Figure 4:
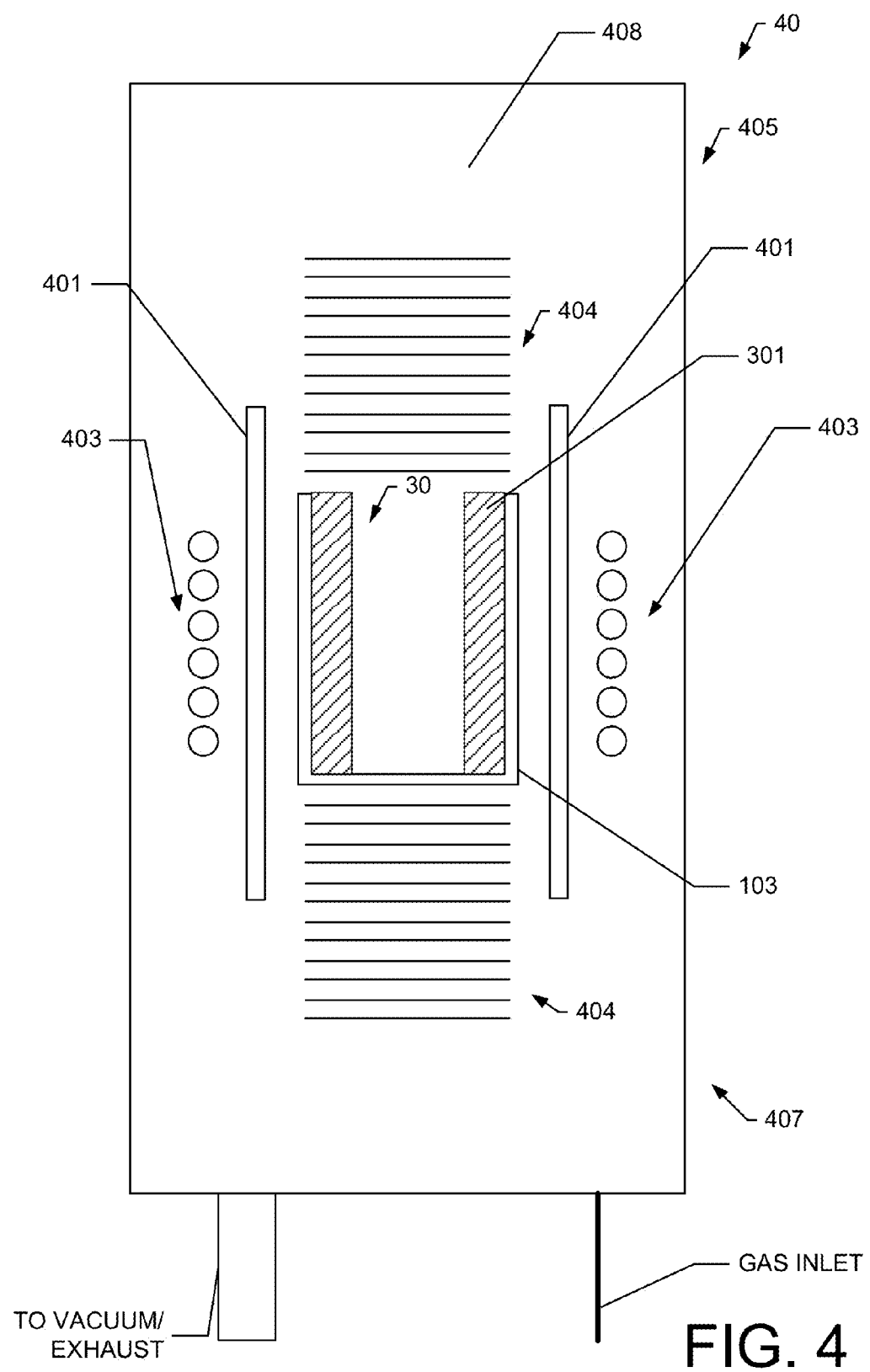
FIG. 4 is a cross-sectional view of a reactor for growing crystals on a charge body according to one embodiment.

The crucible 102 including the charge body 301 (hereinafter referred to as packed crucible 30) is placed in a reactor 40, as shown in FIG. 4. In one embodiment, the reactor 40 is a high temperature induction reactor. In other embodiments, any suitable reactor capable of generating thermal gradients from the exterior to the interior of the packed crucible may be used. The reactor 40 can be heated using any type of suitable heating including but not limited to resistive heating plasma heating, or microwave heating. The precise layout and configuration of reactor components may vary accordingly.

By way of example and not limitation, one embodiment of the reactor 40 uses induction heating. In this embodiment, the packed crucible 30 is heated by a susceptor 401 positioned within a radio frequency induction field generated by the radio frequency induction coil 403. The susceptor 401 can be composed of any suitable and susceptible material, such as tungsten (W), for example. The reactor 40 also includes thermal insulation 404 positioned at the top 405 and bottom 407 portions of the reactor interior 408 moderate the thermal fields with the reactor interior. The thermal fields with the reactor 40 are also controlled and or modified by the positioning of the susceptor 401 within the reactor and the length, coil-to-coil gaping, and positioning of the radio frequency induction coil 403.

Prior to heating the crucible body 30, the reactor 40 may be evacuated to vacuum pressures, backfilled, purged, and evacuated again. In one embodiment using a charge body 301 composed of AlN, the reactor is evacuated to a vacuum at or below $1 \times 10^{-2}$ torr, backfilled/purged with nitrogen, and then evacuated again to a vacuum at or below $1 \times 10^{-2}$ torr. In this embodiment, the crucible body 301 is heated under vacuum to approximately 1700° C. for approximately 2 hours. In one aspect, the heating process is used to drive off unwanted native impurities in the charge body, such as oxides, carbides, and oxynitrides. Additionally, this initial heating is used to sinter the AlN charge body 301.

Figure 5:
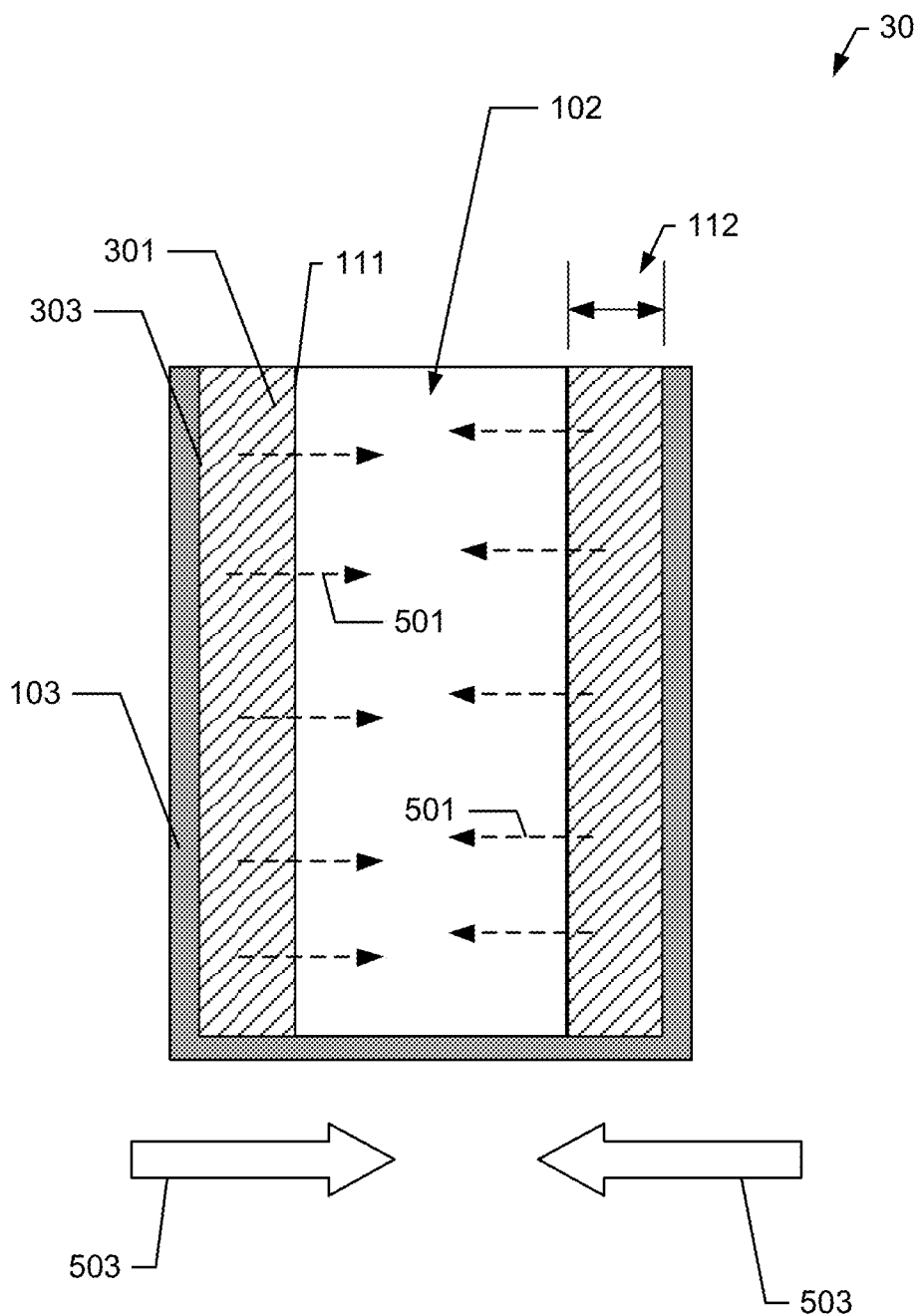
FIG. 5 is an illustration of crystal constituent dissociation in a charge body according to one embodiment

After this initial heating, the reactor 40 is backfilled with nitrogen to a pressure of approximately 980 torr, in one embodiment. The temperature of the crucible body 301 is then increased to 2100-2450° C. over a period of approximately one hour and allowed to soak at 2100-2450° C. for approximately 30 hours. During this soaking period, Al and N disassociate from the exterior wall 303 of the AlN charge body 301, as generally indicated by 501, as shown in FIG. 5. A driving force 503, determined, at least in part, by the chemical concentration and the temperature gradient across the AlN charge body 301, is established inside the crucible 103 and through the AlN charge body, such that the disassociated Al and N diffuse through the porous AlN charge body 301 into the hollow internal cavity 102.

In various aspects, the thermal and chemical driving forces 503 are controlled by the internal thermal fields as moderated by the thermal insulation 405, the susceptor 401 placement and the characteristics of the induction coil 403, such as placement, coil length, and coil-to-coil gaping. The driving forces 503 are also controlled by the particle size of the charge body 301 and the charge body wall thickness 112. For embodiments, using an AlN charge body 30, Al and N are diffused through the AlN charge powder to the internal surface 111 of the charge body where freely nucleated AlN crystallization 603 occurs. The particle size and packing density of the AlN charge body 301 affect the initial nucleation and subsequent growth of AlN crystals on the internal surface 111.

By way of example, after soaking for approximately 30 hours, the temperature of the packed crucible 30 is decreased to below 1000° C. over a period of one hour and allowed to rest and cool to near room temperature for around three hours. After the cooling period, the reactor is evacuated to a vacuum below approximately $1 \times 10^{-2}$ torr and backfilled/purged with nitrogen until an approximate atmosphere pressure is reached and the packed crucible 30 is removed.

Figure 6:
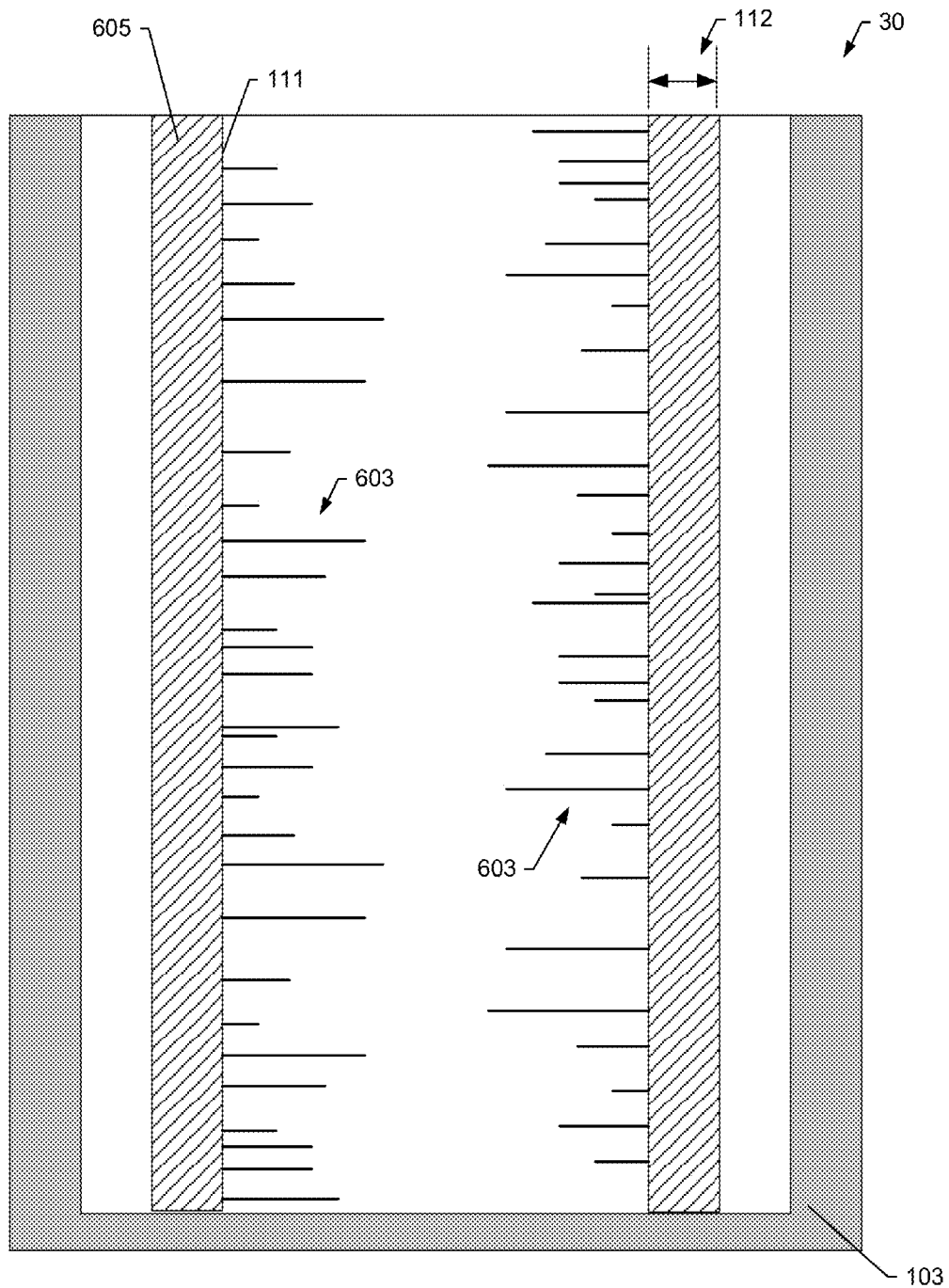
FIG. 6 is a cross-sectional view of crystals grown on a depleted charge body according to one embodiment.
Figure 7:
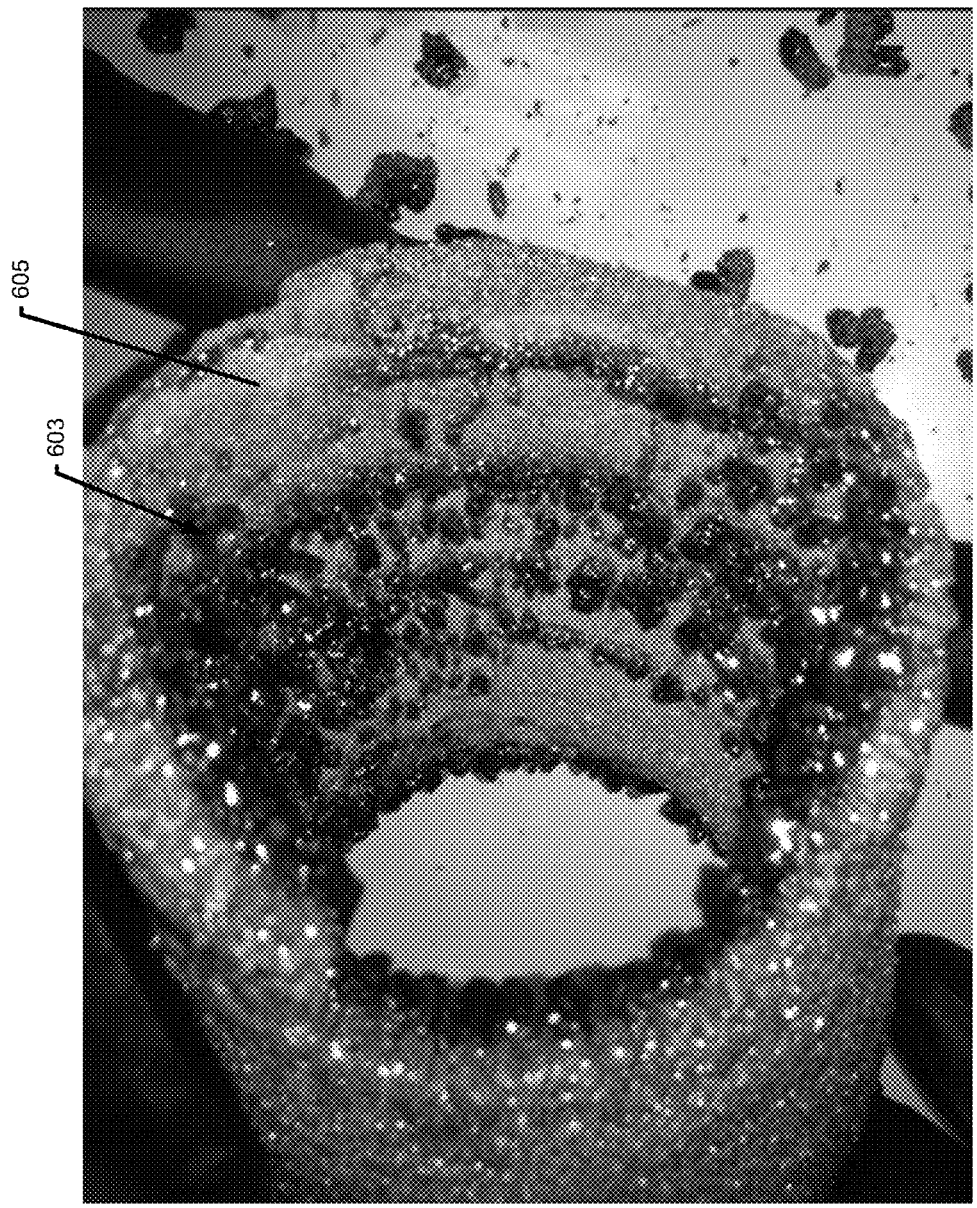
FIG. 7 is photograph of a depleted charge body with crystals grown thereon according to one embodiment.

As shown in FIGS. 6 and 7, The packed crucible 30 now contains a depleted and crystallized AlN body 605 having a smaller wall thickness 112 as compared to the AlN charge body 301 prior to heating. The depleted and crystallized AlN body 605 also includes AlN crystals 603, freely nucleated on the internal surface 111 of the depleted body 605. By way of example and not limitation, approximately 1 to 500 crystals 603, as shown in FIG. 7, may be are produced simultaneously. The produced crystals 603 range in size from 1-30 mm in diameter. In other embodiments, larger and/or smaller crystals may be produced by varying the composition and packing density of the charge body 301 and varying the operation of the reactor 40.

Figure 8:
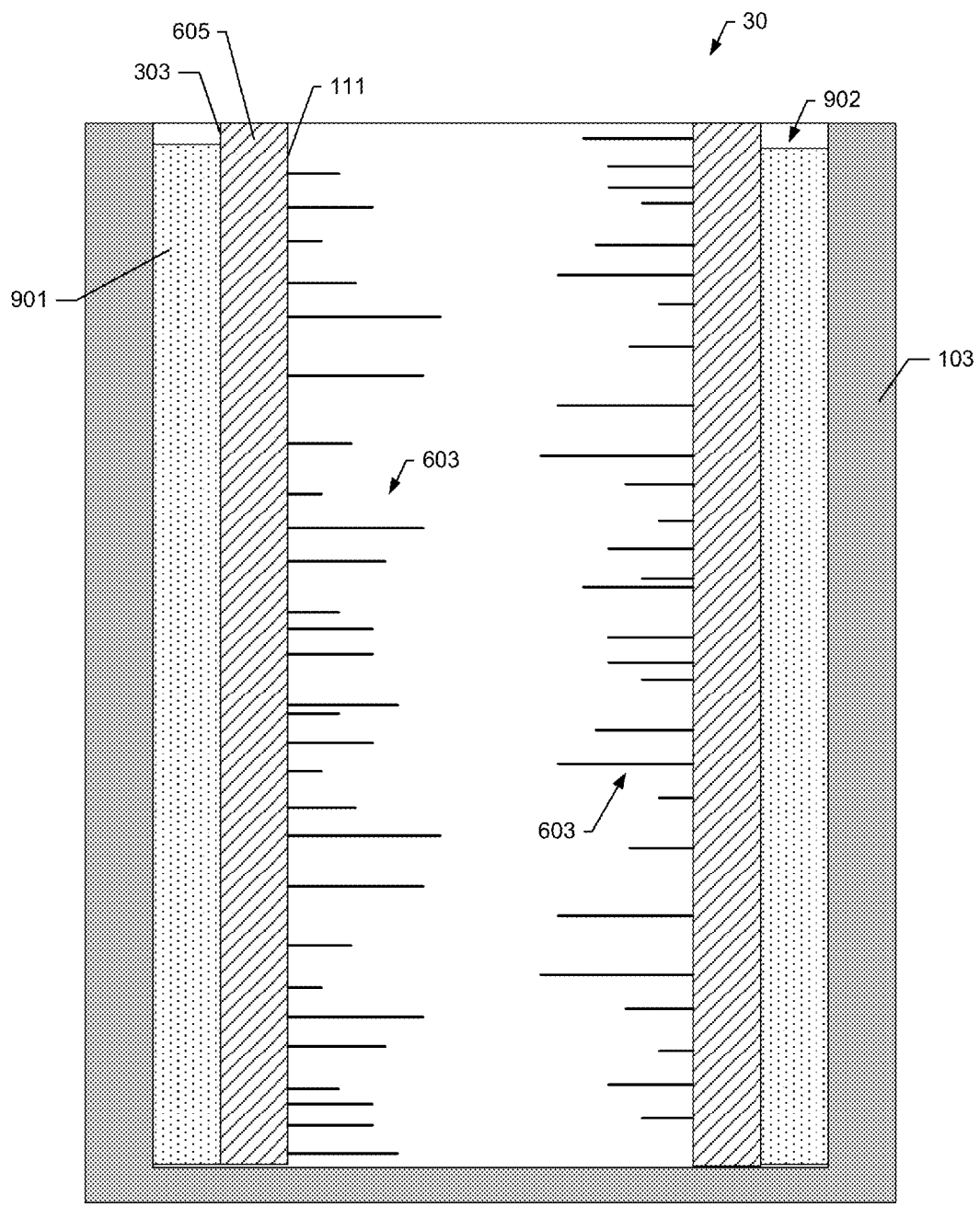
FIG. 8 is a cross-sectional view of a depleted charge body with crystals grown thereon during a recharging process according to one embodiment.

In one embodiment, the packed crucible 30 can be recharged with additional AlN powder 901, as shown in FIG. 8. As shown, additional AlN powder 901 may be packed and compressed in the space 902 between the interior wall 107 of the crucible 103 and the external surface 303 of the depleted AlN body 605. The crucible 103 is then placed into the reactor 40 and the process as previously described is repeated. In various embodiments, the process of recharging the depleted charge body 605 and reinitiating diffusion to further crystal growth may be repeated to increase the crystal size as desired.

Figure 9:
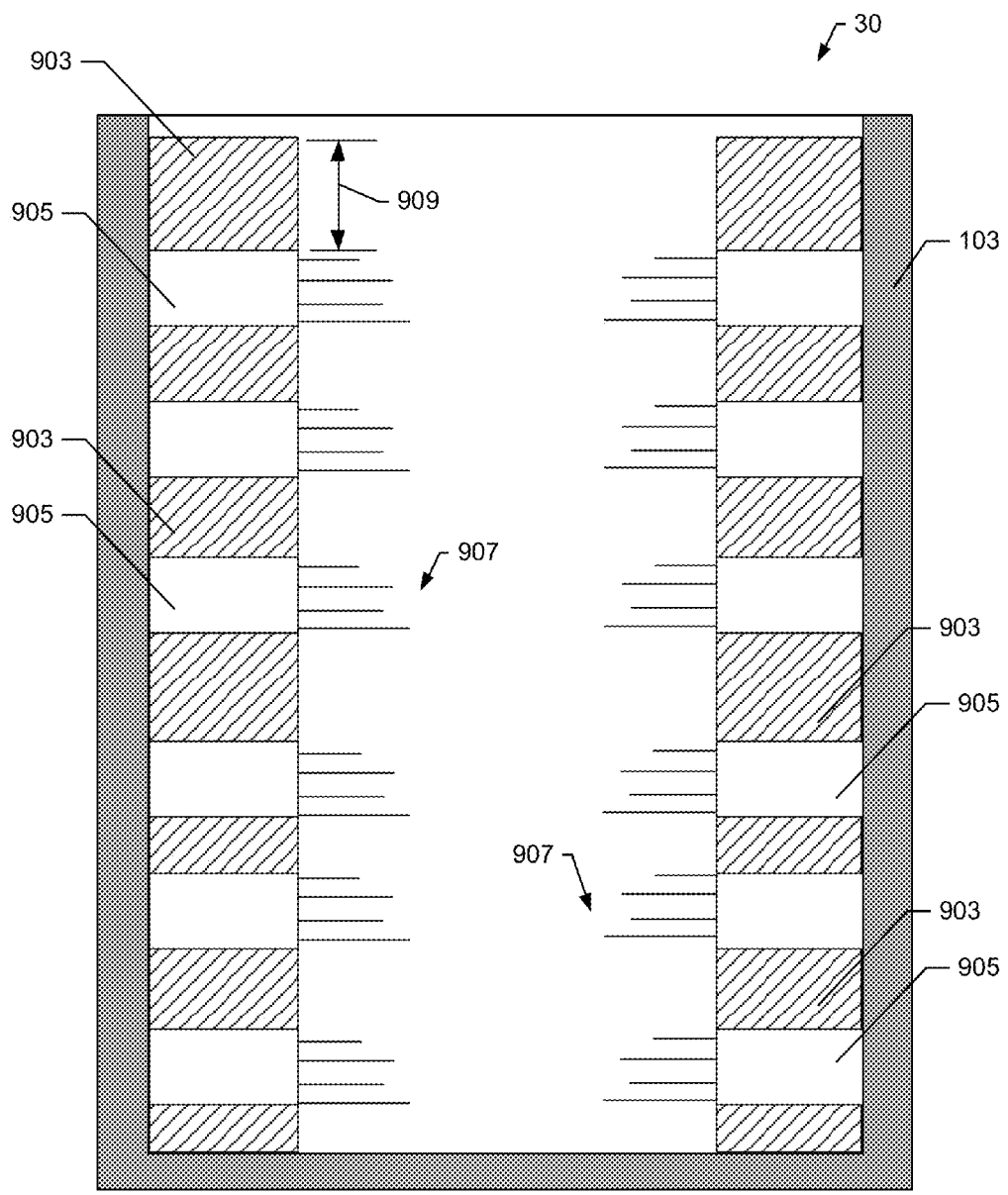
FIG. 9 is a cross-sectional view of crystals grown on a multi-layered charge body according to one embodiment.

The nucleation of the crystals grown may be further controlled by various configurations of the charge body 301 or the use of additional features. In one embodiment, the nucleation of crystals grown from an AlN charge body may be modified by the use of a charge body having at least one layer composed of particles that differ from the particle size of an adjacent layer. For example, an AlN body 301 may be composed of a two particle sizes. In this example, a single layer, similar to layer 903, as shown in FIG. 9, is composed of particles that differ in size from the remainder of the AlN body 301. In one aspect, the particles of the layer 903 are of a size that enhances nucleation, while the remaining particles are of a size that reduces nucleation. The size of all the particles in the AlN body 301 permit internal diffusion between the particles of the enhanced nucleation layer and the remainder of the particles in the body. In this embodiment, the particle size selected to enhance nucleation is a lower fraction of the total AlN body 301 composition. For example, the nucleation enhancing particles of layer 903 may be AlN powder approximately 2 micron in diameter, while the remainder of the AlN body is composed of particles approximately 100 micron in diameter, where the 100 micron diameter particles account for approximately 90% of the total volume of the AlN charge body 301. In other embodiments, the distribution of the nucleation reducing particles is not uniform, yet still forms a majority of the particles of the charge body 301. For example, the particle size the nucleation reducing portion may be a random mixture or preferentially selected.

In another embodiment, as shown in FIG. 9, the AlN body may be composed of multiple charge layers, including alternating nucleation enhancing layers 903 and nucleation reducing layers 905. In this embodiment, the sizes of all the particles in the AlN body 301 are selected to permit internal diffusion between the particles and layers 903 and 905. In this embodiment, the nucleation enhancing layers 903 provide ideal nucleation sites to grow crystals 907, while the particles of the nucleation reducing layers 905 are diffused to provide, at least a portion, of the source Al and N species for crystal growth. As shown, in one embodiment, the multiple charge layers 903 and 905 are arranged horizontally in relation to the internal cavity 102 the AlN 301. In some embodiments, the layers 903 and 905 may alternate and have approximately equal thickness 909, while in other embodiments, the arrangement and thickness of the layers 903 and 905 may vary. Additionally, in some embodiments, the ratio of layers and overall particle distribution between the layers may be equal, while in others the ratio and overall particle distribution may vary.

In yet another embodiment, an inert filler 911 that does not react with the constituent species of the grown crystals may be disposed on or near portions of the interior surface 111 of the charge body 301 to modify the nucleation of crystals grown on the charge body. By way of example and not limitation, the inert filler 911 may be a solid tungsten, zirconium, tantalum, niobium, molybdenum, or other solids that can withstand the temperatures within of the reactor without chemically reacting with the dissociating crystal constituents. In various embodiments, the inert filler 911 may be shaped to physically interact with or modify the crystal growth. Additionally, the inert filler 911 may be used to enhance or alternatively, retard crystal growth at nucleation sites on the interior wall 111 of the charge body 301.

In one embodiment, the inert filler may be a porous body 911 that defines one or more holes, apertures, or slits to permit gas diffusion and provide desired crystal growth locations. The porous body 911 may be positioned to contact the interior surface 111 of the charge body 301 or may be disposed within the charge body and may include apertures that may be randomly positioned or arranged in a desired orientation. Additionally, the size of the apertures may be varied or they may be uniform.

Figure 18:
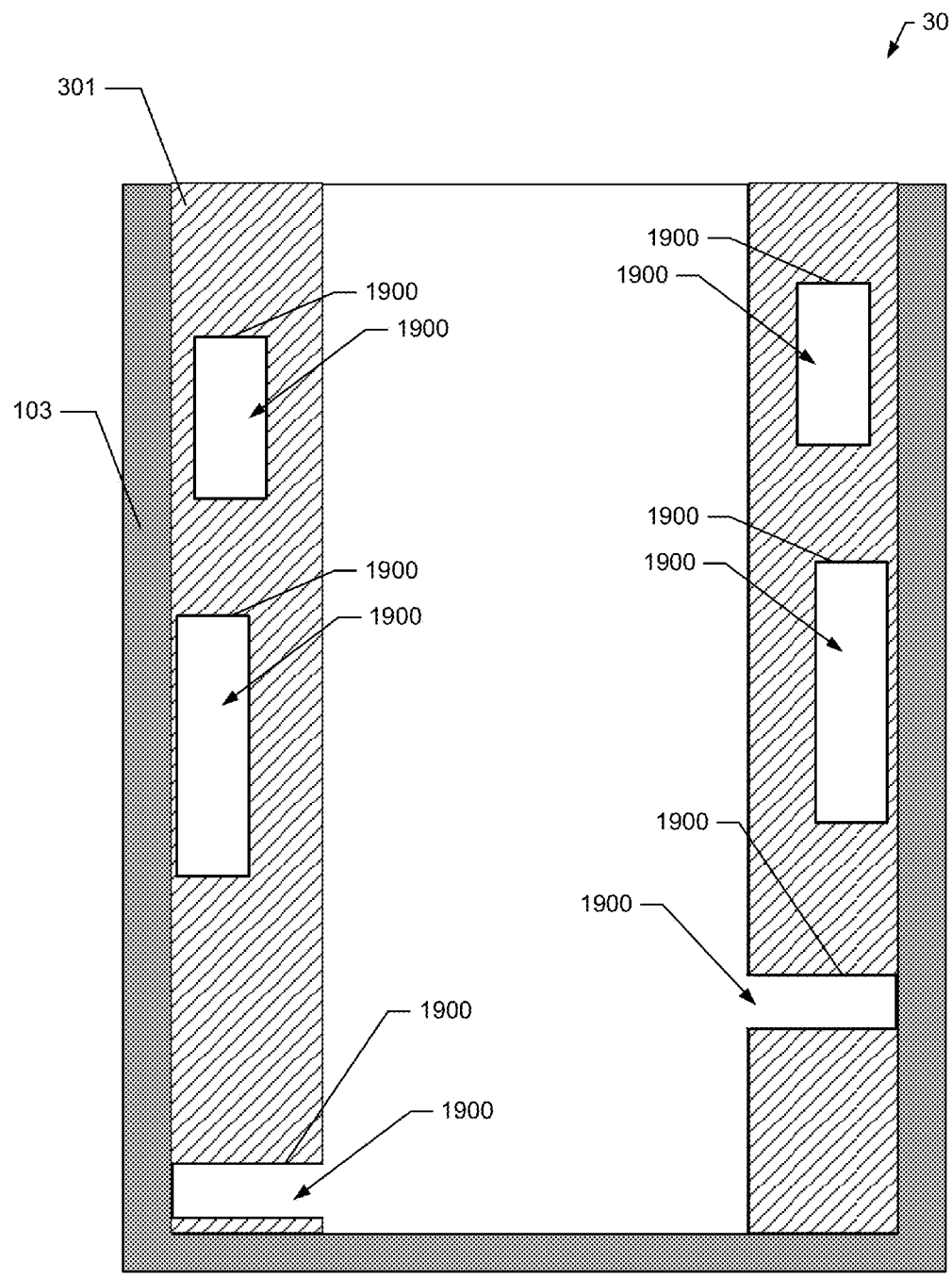
FIG. 18 is a cross-sectional view of a crucible and charge body with through holes disposed therein according to one embodiment.

In one embodiment, as shown FIG. 18, the crystal nucleation may be controlled by the partial or full through-holes or lumens 1900 defined in the charge body 301. This can also be done using a tantalum or tungsten tube to ensure the partial or full through holes 1900 do not collapse under compression. In one particular, embodiment, the partial or full through holes are formed by the positioning the filler material in the charge body 301 prior to compression. In another embodiment, filler material to form the partial or full through holes is introduced after compression and formation of the charge body 301.

Figure 14:
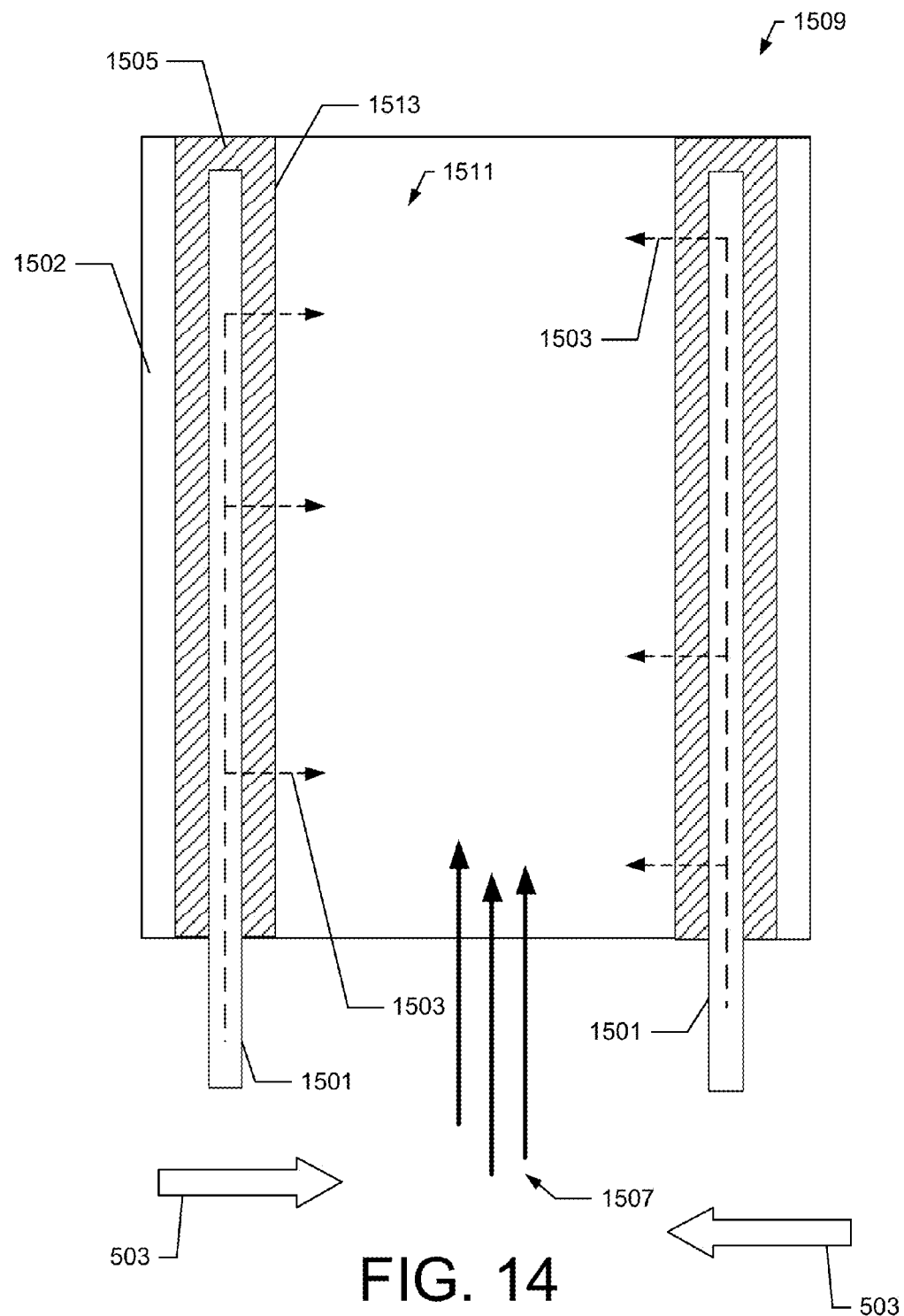
FIG. 14 is a cross-sectional view of a crucible and charge body with a porous second body with gas supply tubes disposed therein according to one embodiment.

In various other embodiments, c-plane oriented AlN crystals may be grown using Aluminum Chlorides ($AlCl_x$) diffused through a substantially/sufficiently porous charge body 1505 of AlN powder which contacts cross-flowing ammonia ($NH_3$) gas. FIG. 14 is a partial cross-section view of a portion of a high temperature reactor 1509. As shown, an AlN charge powder having particles varying in size from about 0.1 microns to 1 mm is loaded inside a hollow crucible 1502 that includes or is configured to receive one or more gas inlet tubes 1501. In one aspect, the crucible 1502 is an open ended crucible, as shown. In one embodiment, up to 1.5 kg of the charge powder is packed around a packing tube, such as the packing tube 105, and compressed as previously described. As shown, the formed AlN charge body 1505 is formed around the gas inlet tubes 1501.

Figure 13:
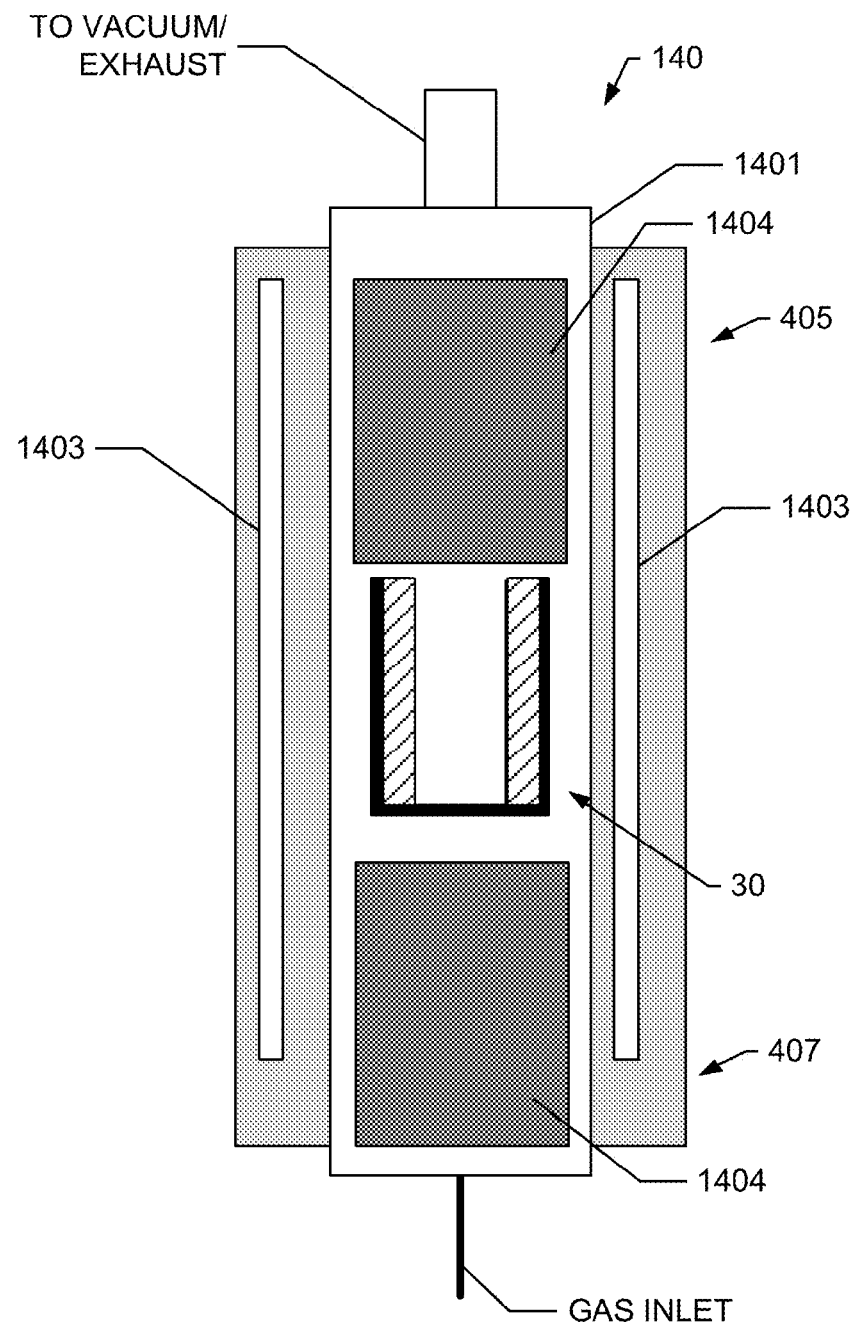
FIG. 13 is a cross-sectional view of a tube reactor for growing crystals according to one embodiment.

The crucible 1502 including the AlN charge body 1505 is placed in a high temperature reactor, such as an induction reactor, for example. In this example, a high temperature induction reactor, similar to the reactor 40 shown in FIG. 13 is evacuated, backfilled/purged with nitrogen and then evacuated again as previously described. In one embodiment, the crucible 1502 is heated under vacuum to about 1700° C. for about 2 hours to drive off native impurities and to sinter the AlN charge body. The reactor 1509 is backfilled with nitrogen to a pressure of approximately 980 torr. The crucible 1502 is then heated and maintained at a temperature between 1400-1900° C. for one hour or more and allowed to soak for approximately 15 hours. Aluminum Chloride (AlCl$_3$) 1503 is pumped into the gas inlet tubes 1501 to function as an Aluminum source. In addition, ammonia gas 1507 is allowed to flow through the open ended crucible 1502, where it functions as a nitrogen source to contact the interior surface 1513 of the AlN charge body 1505.

A driving force 503, defined, at least in part, by the pressure of the AlCl 1503 gas is established inside the crucible and across the AlN charge body such that the AlCl gas driven to diffuse through the charge body and into the interior cavity 1511 of the crucible 1502. In one aspect, the diffusion of the AlCl is controlled by the pressure differential between the AlCl gas and the internal pressure of the reactor. The AlCl is diffused through the AlN charge body 1505 to the internal surface 1513 where the AlCl reacts with the NH3 to freely nucleated AlN crystals on the internal surface. In another aspect, the AlN powder particle size and packing density of the AlN charge body 1505 impact the initial nucleation and subsequent growth of AlN crystals on the internal sidewalls 1513. After eight hours, the crucible 1502 is cooled down to below 1000° C. over one hour and allowed to rest for around three hours. After such time the reactor is evacuated less than $1\times10^{-2}$ torr, backfilled/purged with nitrogen to atmosphere pressure, where the crucible 1502 is then removed. In this embodiment, approximately 50-500 crystals ranging in diameter from about eight mm to about fifteen mm are produced.

C-Plane Oriented AlN Crystal Growth

Figure 11:
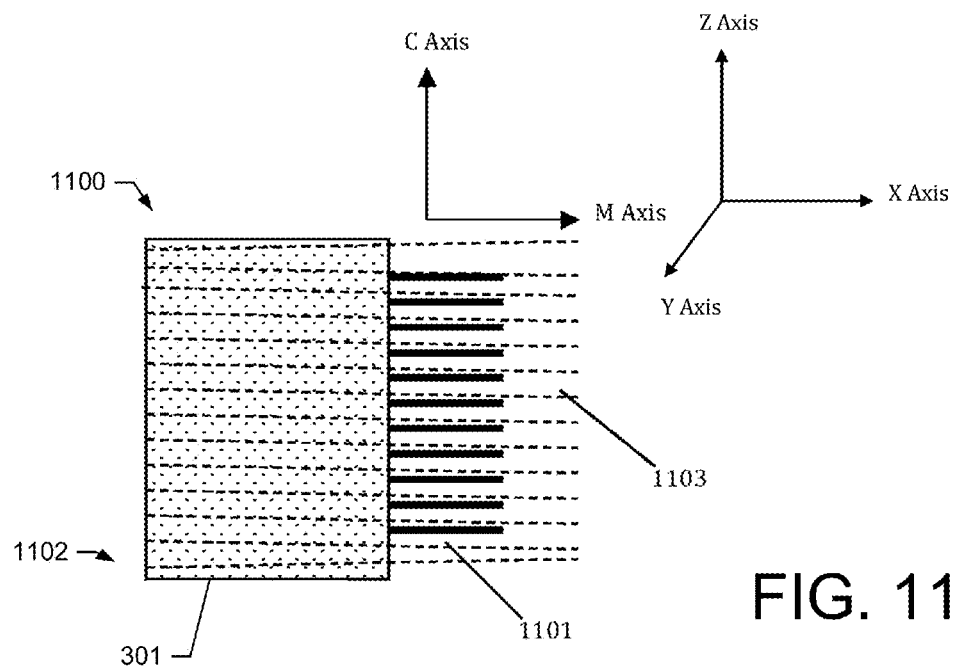
FIG. 11 is an illustration of c-plane platelet growth on a charge body according to one embodiment.

Referring now to FIG. 11, c-plane AlN crystals 1101 larger than 1-30 mm in diameter may be produced. According to one embodiment, large AlN crystals may be produced on the inside surface 111 of the AlN charge body 301 by orienting isotherms 1103 within the charge body to align substantially parallel to the top portion 1100 and bottom portion 1102 of the AlN charge body. As shown, the c-plane of the AlN crystals aligns closely to the cooler isotherm lines 1103. In this embodiment, relatively thin (i.e. less than 2 mm thick) c-plane AlN crystals can be produced. In one aspect, when the temperature gradient between isotherm lines are sufficiently low (less than 20° C. per mm) growth in the z direction of the c-plane is slowed in comparison to the growth in the X-Y direction of the c-plane.

In another embodiment, large c-plane oriented AlN crystals may be grown using a charge body 301 composed of a mixture of AlN and tungsten (W) powder. In this embodiment, c-plane AlN crystals larger than 1-30 mm in diameter are controllability grown on the interior surface of the AlN/W charge body using diffused Al and nitrogen through the porous charge body. AlN powder having particles in range from about 0.1 microns to 1 mm in diameter is mixed with W powder having particles in a range from about 0.1 microns to 1 mm. The distribution of the AlN and the W powder can be a random mix or preferentially orientated. In one embodiment, similar to that described in reference to FIGS. 1-4, the AlN/W charge body is approximately 0.001-95% W by volume. In this embodiment, up to 2.0 kg of the AlN/W powder mixture is added to the crucible 103 to form the charge body 301.

In yet another embodiment, large c-plane oriented AlN crystals may be grown using a charge body 301 composed of a mixture of AlN and Aluminum (Al) powder. In this embodiment, c-plane AlN crystals larger than 1-30 mm in diameter are controllability grown on the interior surface 111 of the AlN/W charge body using diffused Al and nitrogen through the porous charge body. AlN powder having particles in range from about 0.1 microns to 1 mm in diameter is mixed with Al powder having particles in a range from about 0.1 microns to 1 mm. The distribution of the AlN and the Al powder can be a random mix or preferentially orientated. In one embodiment, similar to that described in reference to FIGS. 1-4, up to 1.5 kg of the AlN/W powder mixture is added to the crucible 103 to form the charge body 301.

In various other embodiments, the reactor configuration shown in FIG. 14, may be used to produce c-plane oriented $Al_xGa_{(1-x)}N$ crystals by diffusing aluminum chlorides (AlCl$_x$) and gallium chlorides (GaCl$_x$) through a porous body. The porous body is composed of a mixture of AlN powder, GaN powder, Magnesium (Mg) powder and Indium (In) powder, where the combination of Mg and In functions as an impurity getter. The AlN/GaN/MG/In powder mixture is packed and compressed in to crucible as previously described in relation to FIGS. 1-4. AlCl$_x$gas(es) and GaCl$_x$-gas(es) are then pumped through the gas inlet tubes 1501 to facilitate the diffusion and subsequent nucleation of the Al and Ga species along with N species on the interior surface 1513 of the AlN/GaN/MG/In charge body.

Similarly, in another embodiment c-plane oriented GaN crystal may be grown via the diffusion of Ga and N species through a porous charge body composed of a GaN/In powder mix, where the In powder functions as an impurity getter.

M-Plane Oriented AlN Crystal Growth

Figure 12:
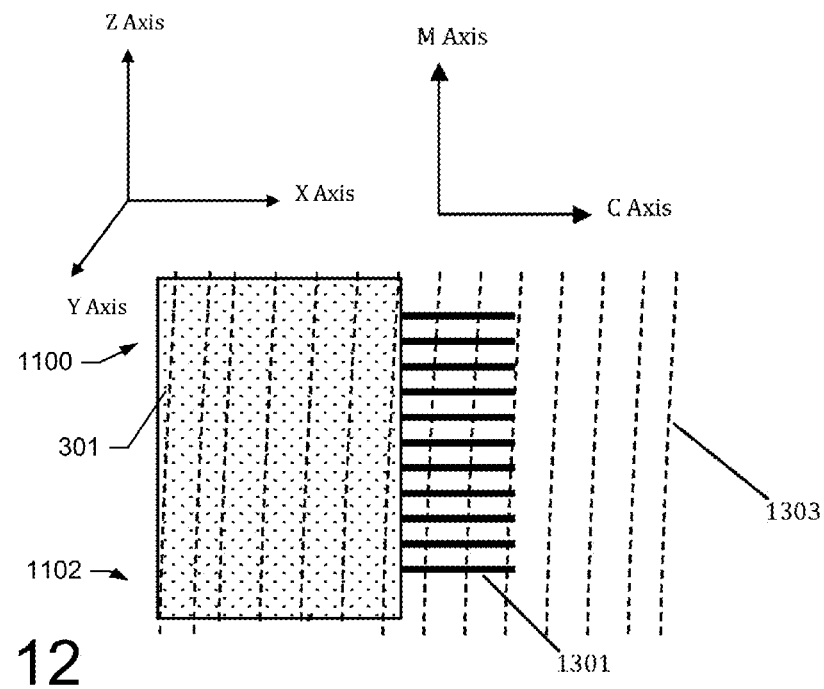
FIG. 12 is an illustration of m-plane platelet growth on a charge body according to one embodiment.

Referring now to FIG. 12, m-plane AlN crystals 1301 larger than approximately 1-15 mm in diameter may be produced. According to one embodiment, large AlN crystals may be produced on the inside surface 111 of the AlN charge body 301 by orienting isotherms 1303 within the charge body to be sufficiently perpendicular to the top portion 1100 and bottom portion 1102 of the AlN body. As the c-plane of the AlN crystals aligns to the colder isotherm lines, thick (i.e. greater than 5 mm) and long (longer than 5 mm) m-plane AlN crystals are produced. In one aspect, when the temperature gradient between isotherm lines is sufficiently low (i.e. less than 20° C. per mm) growth in the X-Y direction of the M-plane is increased in comparison to the growth in the Z direction of the m-plane.

Growth of GaN Crystals

In various of embodiments, the systems and methods of the present disclosure may also be used to grow GaN (GaN) crystals. In one aspect, c-plane oriented GaN crystals are grown by diffusing Ga and nitrogen through a porous body of GaN powder, in a manner similar to that previously described regarding AlN crystals.

In one embodiment, the powder charge 101 comprises GaN powder having particles sized in a range between about 0.1 microns and 1 mm. The GaN powder charge 101 is loaded inside the crucible 103 and compressed about the internal packing tube 105. In one embodiment, the crucible has an external diameter of approximately 3 inches while the internal packing tube 105 has an external diameter of approximately about 1.5 inches. Approximately 0.5 kg of GaN powder is added to the crucible and compressed as previously described to form a GaN charge body 301 with an internal cavity 102. In other embodiments, other combinations of the diameters for the crucible 103 and the packing tube 105, may be used to create a charge bodies of any desired thickness 112.

In this embodiment, for growing GaN crystals, the packed crucible 30 containing the GaN charge body 301 is placed in a high-temperature tube furnace 140 as shown in FIG. 13. The packed crucible 30 is placed inside a process tube 1401 that may be composed of quartz, $Al_2O_3$ or any other suitable material. The packed crucible 30 is then heated by one or more resistive heating elements 1403. The furnace 140 includes suitable thermal insulation 1405 around the process tube 1401 and further includes one or more layers of $Al_2O_3$ insulation 1404 at the top portion 1405 and bottom portion 140 of the process tube to control the internal thermal fields and placement of the packed crucible 30 with in the process tube.

The high temperature tube furnace 140 is in communication with a vacuum system 1409. Similar to the reactor 40 described for the production of AlN crystals, the tube furnace 140 is evacuated to a vacuum of less than approximately $1\times10^{-2}$ torr, backfilled, purged with nitrogen, and then evacuated again to a vacuum less than approximately $1\times10^{-2}$ torr. The packed crucible 30 is heated under vacuum to about 800° C. for approximately one hour to drive off native impurities, such as oxides, carbides, and oxynitrides, among others, in the GaN charge body 301 and to sinter the GaN charge body.

After this initial heating, the reactor is backfilled with ammonia ($NH_3$) or an ammonia/nitrogen mix to a pressure of about 600 torr. The packed crucible 30 is then heated to 1000-1230° C. over one hour and allowed to soak at 1000-1230° C. for approximately eight hours. During this soaking period, Ga and N disassociate from the exterior wall 303 of the GaN charge body 301. A driving force 503, controlled, at least in part, by the chemical concentration and the temperature gradient across the GaN charge body 301, is established inside the crucible 103. The driving force 503 traverse the GaN charge body 301, such that the disassociated Ga and N diffuse through the porous GaN charge body into the hollow internal cavity 102. The thermal and chemical driving force is controlled by: internal thermal fields, established by the multiple layers of insulation on, the crucible placement inside the tube furnace 140, the internal insulation inside the tube furnace, the GaN powder particle size, and the GaN charge body thickness. The Ga and N diffused through the powder to the internal surface of the charge body where freely nucleated GaN crystallization occurs.

In this embodiment, ammonia gas is used as an active nitrogen source to enhance the nitrogen partial pressures within the reactor 140. In this and other embodiments, the ammonia gas introduced into the process tube 1401, may be pure $NH_3$ gas or, alternatively, the ammonia gas may be a mixture one or more carrier, dopant and/or inert gas(es).

In one aspect, the GaN powder charge 101 particle size, the packing density of the GaN charge body 301 and the $NH_3$ gas flow rate affect the initial nucleation and subsequent growth of GaN crystals on the internal sidewall.

After soaking for approximately eight hours, the crucible 103 is allowed to cool down to below 200° C. over a period of approximately one hour and allowed to rest and return to near room temperature for around three hours. The furnace 140 is the vacuumed to below $1\times10^{-2}$ and backfilled/purged with nitrogen to approximately atmosphere pressure and the crucible 103 is removed.

The crucible 103 now contains a depleted GaN charge body 605 with a reduced external diameter and GaN crystals freely nucleated on the internal surface 111 of the depleted GaN charge body. In one aspect, approximately 50-200 crystals having diameters in a range between about 1 mm and 15 mm are produced at one time.

At this time, the depleted GaN charge body can be recharged with GaN powder, similar to the recharging of the depleted AlN charge body, previously described in reference to FIG. 8. Additional charge powder (901 is packed between the interior wall 107 of the crucible 103 and the external surface 303 of the depleted GaN charge body 605. The crucible is then placed once again into the high temperature tube furnace 140 and the process as previously described is repeated. In various embodiments, the process of recharging the depleted charge body 605 and reinitiating diffusion to further crystal growth may be repeated to increase the crystal size as desired.

Figure 10:
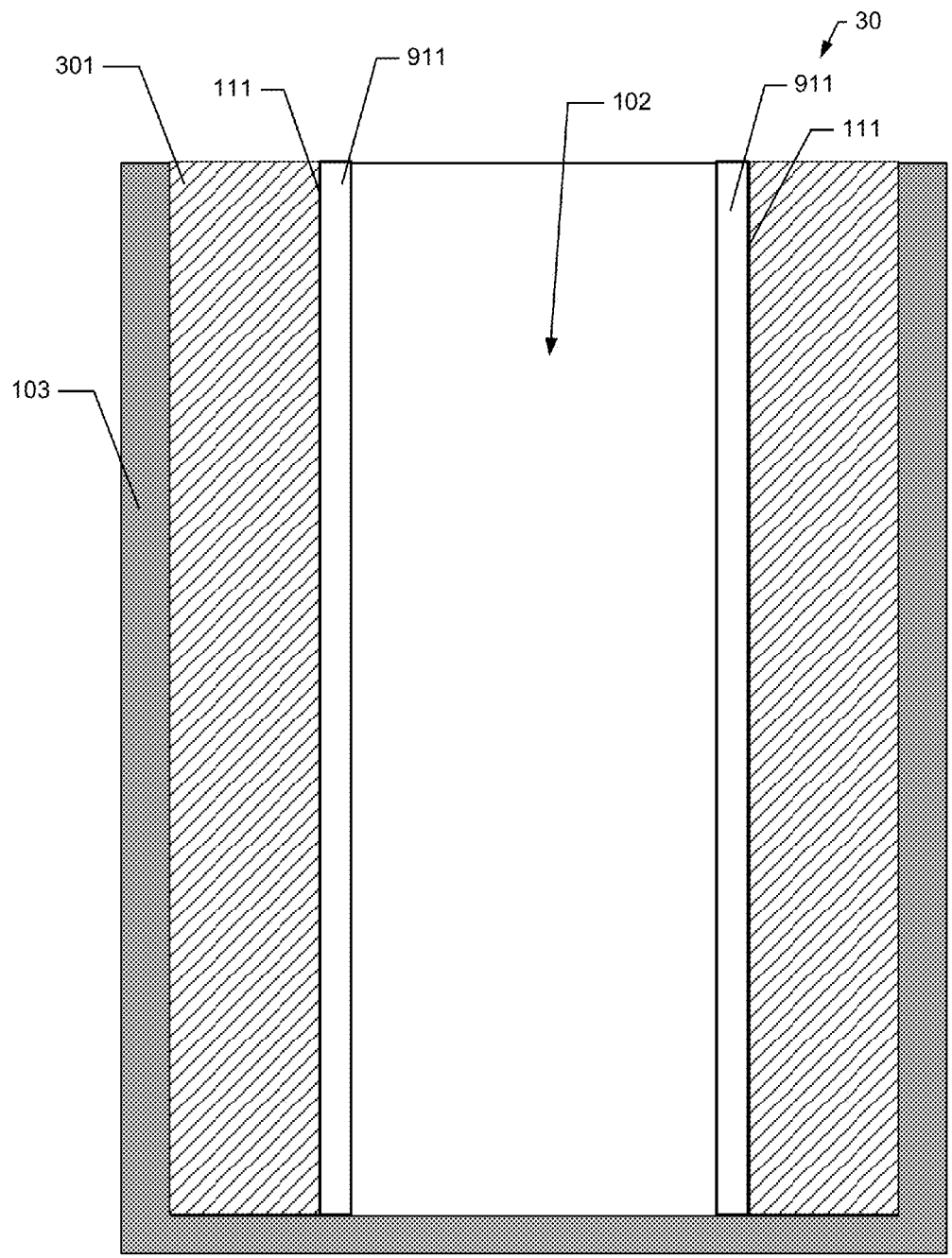
FIG. 10 is a cross-sectional view of a crucible and charge body with a porous second body disposed therein according to one embodiment.

Nucleation of the GaN crystals may be further controlled by various configurations of the charge body 301 or the use of additional features. Similar to the modification of the charge body 301 for growing AlN crystals and previously described in reference to FIGS. 9-10 and 18, the nucleation of GaN crystals may also be controlled and modified by forming layers of varying particle size in the GaN charge body and the use of inert filler materials. In various aspects, however, the nucleation of GaN crystals may be further controlled and/or modified by varying the flow rate of ammonia through the tube reactor 140.

Additionally, nucleation of the GaN crystals may be modified, controlled, or otherwise affected by the direction that the ammonia gas contacts the GaN charge body. In embodiments, shown in FIGS. 15 and 16, the crucible 101 selected for growing GaN crystals 1605 may include a porous bottom surface 1601 that allows the ammonia gas 1603 to enter the crucible and contact the GaN charge body 301 substantially parallel to the interior surface of the charge body 1607. In these embodiments, the porous bottom 1601 may include any material that allows sufficient ammonia transport across the bottom surface 1601. In one example, the bottom surface 1601 may be composed of GaN. In this aspect, the driving force 503, defined at least in part by the temperature gradient and chemical concentration of the GaN charge body 1607 may be further modified by the increased partial pressure of ammonia in the interior cavity 102

Figure 16:
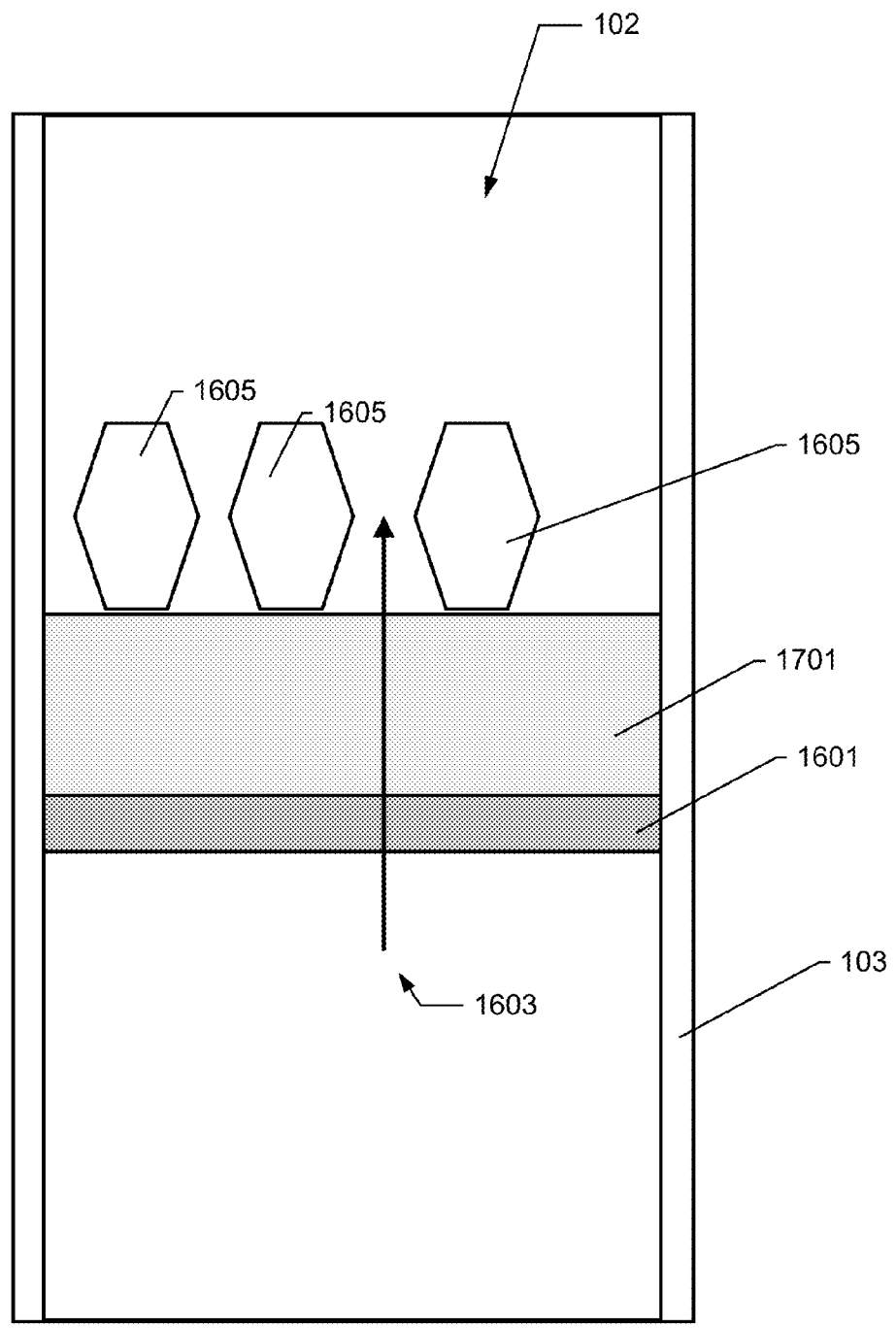
FIG. 16 is a cross-sectional view of a reactor system using a crucible with a porous bottom surface according to one embodiment.

FIG. 16 is a cross-sectional view of a reactor process tube 1401 for growing GAN crystals 1605 on a solid GaN charge body 1701 in a crucible 103 having a porous bottom surface 1601 according to one embodiment. As shown, the porous bottom 1601 allows ammonia gas 1603 to enter the crucible 101 and transfer into and through the solid charge body 1701 for growing GaN single crystals 1605 on a top surface of the charge body. In this embodiment, the solid GaN charge body 1701 is comprised of a compressed slab of GaN powder. In one aspect, a solid charge body 1701 may be formed by compressing a charge powder 101 in a crucible without the use of a tube, such as the packing tube 105. The resulting solid charge body 1701 has a generally disc shape, and may be formed to have any desired thickness.

Figure 15:
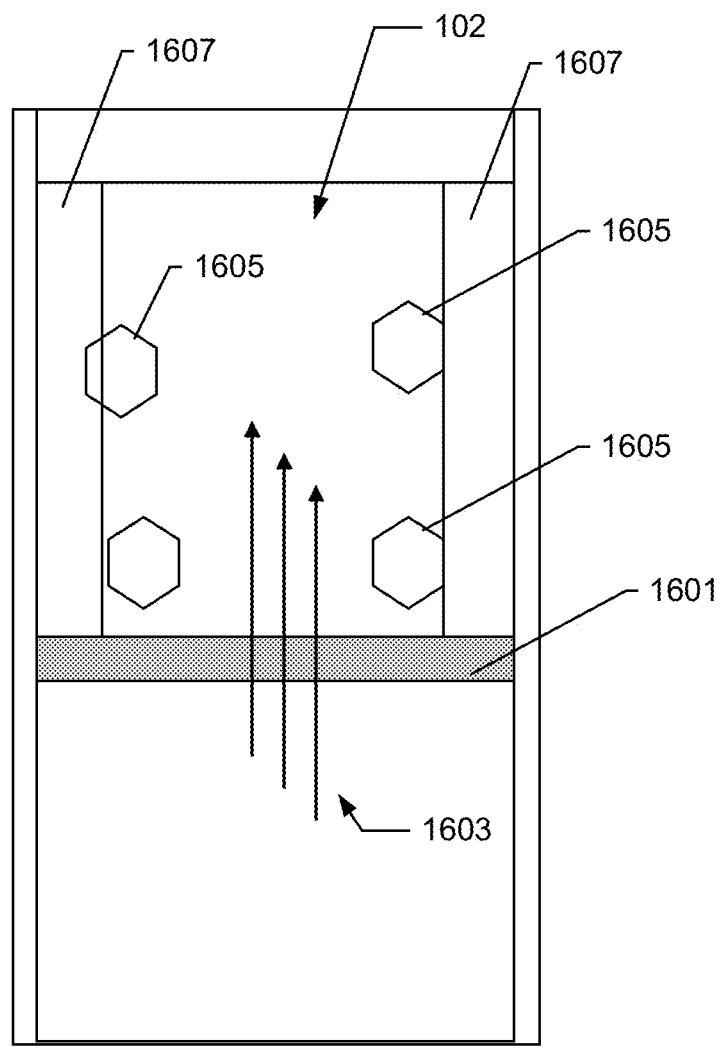
FIG. 15 is a cross-sectional view of a reactor system using a crucible with a porous bottom surface according to one embodiment.

Similar to the embodiment, shown in FIG. 15, the porous bottom 1601 may include any material that allows sufficient ammonia transport across the bottom surface 1601. In one example, the bottom surface 1601 may be composed of GaN. In this aspect, the driving force 503, defined at least in part by the chemical concentration and temperature gradient within the solid GaN charge body 1701 may be further modified by the increased partial pressure of ammonia in the remaining cavity of the crucible 103.

Figure 17:
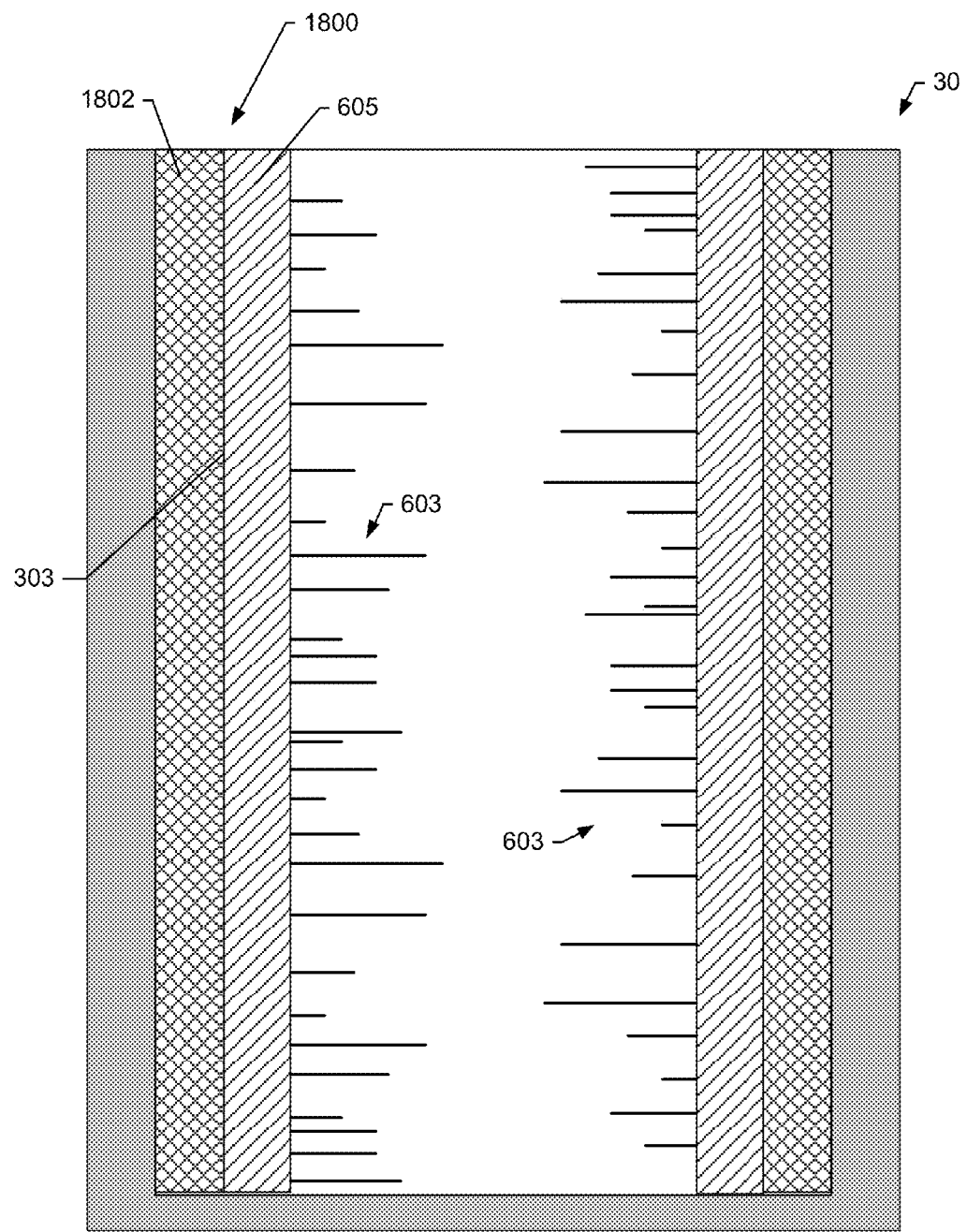
FIG. 17 is a cross-sectional view of a crucible and charge body with a recharged second body according to one embodiment.

In various other embodiments, the reactor configuration shown in FIG. 16 and the related processes described herein, may be used to manufacture c-plane oriented GaN crystals using NH3 gas that is diffused through a solid porous plate of $Al_2O_3$ 1703 and a solid GaN charge body 1701, as shown in FIG. 17. The solid GaN charge body 1701 may be prepared as previously described, while the solid porous plate of $Al_2O_3$ may be prepared by any suitable method.

C-Plane GaN Crystal Growth

The various embodiments of growing GaN crystals, as disclosed herein may be used to produce c-plane GaN crystals larger than 15 mm in diameter. The c-plane crystal growth shown in FIG. 11 and described in relation to AlN crystals similarly applies to GaN crystals. In particular, the crystals 1101 are controllability produced on the inside surface of a GaN charge body by setting the internal GaN charge body isotherms sufficiently parallel to the top portion 1100 and bottom portion 1102 of the charge body. As the c-plane of the GaN crystals aligns to the colder isotherm lines, thin (less than 2 mm thick) c-plane GaN crystals can be produced. Therefore, when the temperature gradient between the isotherm lines 1103 is sufficiently low (e.g. less than 20° C. per mm) growth in the z direction of the c-plane is slowed in comparison to the growth in the X-Y direction of the c-plane.

In yet another embodiment, c-plane oriented GaN crystals may be grown using diffused Ga and nitrogen through a substantially or sufficiently porous charge body comprised of a mixture of GaN and AlN. In this embodiment, an GaN/AlN charge body is formed similar to the processes described in relation to FIGS. 1-4. In one aspect, c-plane GaN crystals larger than 15 mm may be controllability grown on the inside surface of the GaN/AlN charge body.

By way of example and not limitation, GaN powder having particles of varying size in a range from about 0.1 microns to 1 mm is mixed with AlN powder of varying size from about 0.1 microns to 1 mm. The distribution of the GaN and the AlN powder may be a random mix or it may be prepared to a particular desired distribution. The GaN/AlN powder mixture is loaded and compressed in a crucible in an annular cavity defined by the crucible and a packing tube, in a manner substantially similar to that as previously described, in order to produce a GaN/AlN charge body similar to the charge body 301.

Multi-Layer Crystal Growth

FIG. 17 is a cross-sectional view of a crucible 103 containing a depleted AlN charge body 605 that may be used to grow c-plane oriented GaN crystals on top of c-plane oriented AlN crystals, according to one embodiment. The AlN crystals 603 are grown on a depleted AlN charge body 605, in accordance with any of the methods or processes previously described in relation to FIGS. 1-14.

In this embodiment, the depleted AlN charge body 605 is recharged with GaN powder. The GaN powder 1802 is packed between the interior wall 107 of the crucible 103 and the external surface 303 of the depleted AlN body 605. This results in a packed crucible 30 that contains a GaN/AlN interface charge body 1800. The packed crucible 30 with the GaN/AlN interface body is placed in a high temperature tube furnace, similar to the furnace 140 shown in FIG. 14. The packed crucible 30 is then heated by one or more resistive heating elements 1403. The furnace 140 includes suitable thermal insulation 1405 around the process tube 1401 and further includes one or more layers of $Al_2O_3$ insulation 1404 at the top portion 1405 and bottom portion 1407 of the process tube 1401 to control the internal thermal fields and placement of the packed crucible 30 with in the process tube.

The high temperature tube furnace 140 is evacuated to a vacuum of less than approximately 1×10-2 torr, backfilled, purged with nitrogen, and then evacuated again to a vacuum less than approximately 1×10-2 torr. The packed crucible 30 is heated under vacuum to about 800° C. for approximately two hours to drive off native impurities, such as oxides, carbides, and oxynitrides, among others, in the GaN/AlN interface charge body 1800 and to sinter the GaN in the. After which the furnace 140 is backfilled with ammonia to a pressure of 980 torr.

The packed crucible 30 is then heated to 1000-1230° C. over one hour and allowed to soak at 1000-1230° C. for approximately eight hours. During this soaking period, Ga and N disassociate from the exterior wall of the GaN portion of the GaN/AlN interface charge body 1800. A driving force 503, controlled, at least in part, by the chemical concentration and the temperature gradient across the GaN/AlN interface charge body 1800, is established inside the crucible 103. The driving force 503 traverse the GaN/AlN interface body charge body, such that the disassociated Ga and N diffuse through the porous GaN/AlN interface body charge body into the hollow internal cavity 102. In one aspect, the thermal and chemical driving force is controlled, at least in part by internal thermal fields established by the multiple layers of insulation, the crucible placement inside the tube furnace, the internal insulation inside the tube furnace 140, the particle size, and the thickness of the GaN body. Ga and N diffuse through the GaN powder 1802 to the internal surface of the GaN/AlN interface charge body 1800 where re-nucleation of a GaN layer occurs on the existing AlN crystals.

The ammonia provided to the process tube 1401 serves as an active nitrogen source to enhance the nitrogen partial pressures. The initial nucleation and subsequent growth of GaN crystals on the AlN crystals is impacted by GaN powder particle size, packing density of the GaN body portion and ammonia flow rate.

After approximately eight hours, the crucible is cooled down to below 200° C. over one hour and allowed to rest for about three hours. The furnace 140 is the vacuumed to below $1 \times 10^{-2}$ and backfilled/purged with nitrogen to approximately atmosphere pressure and the crucible 103 is removed.

The GaN/AlN interface charge body 1800 is now depleted of the GaN portion 1802 and has an external diameter similar to the external diameter of the depleted AlN charge body 605 prior to the addition of the GaN powder 1802. In various aspects, approximately 50 to 200 crystals, ranging in diameter from 1 mm to 15 mm are produced.

This example shows how to manufacture c-plane oriented GaN crystal using diffused Ga and nitrogen through a substantially/sufficiently porous body of GaN/In powder mix using In as a impurity getter as starting material.

Although the crucibles, such as the crucible 103 and 1502 are described as being either open-ended or having a closed bottom, the various embodiments disclosed herein may be modified for use with either open-ended or closed bottom crucibles. For example, any suitable, heat tolerant material may be positioned within an open ended crucible, such as the crucible 1502, to support a charge body, such as the charge body 301.

In various embodiments, when using a chemically-derived source such as aluminum chloride, the porous charge body, such as the charge bodies 301 or 1505, need not contain either nitrogen or aluminum. However, in other embodiments, a porous AlN foam can be used as a primary charge body, that is consumed during crystal growth. In these embodiments, the AlN foam may serve as the source of both the aluminum and nitrogen species for the subsequent growth of the crystals. Alternately, the AlN foam may be used a non-consumable secondary porous body. For example, when growing GaN crystals, the porous AlN foam body may serve a as a nucleation center that is not consumed during the growth process.

In one embodiment, a method for making AlN foam includes heating aluminum foam until it approaches its melting temperature in an atmosphere of ammonia and or nitrogen. This may be performed in any environment at any pressure, such as atmospheric pressure, low-pressure, or high-pressure. In another embodiment, the Al foam may be heated to temperatures above the aluminum melting point in an ammonia environment in which the pressure is rapidly reduced to atmospheric pressure, thereby causing a flash nitridation of the foam aluminum.

In various embodiments, the crystal source material, including but not limited to Al or Ga, may be provided as a polycrystalline mass that is in contact with the porous charge body. For example, a source of AlN may be a large polycrystalline tubular structure, is used in conjunction with either, a compressed AlN charge body positioned on the interior of the polycrystalline tubular structure or a non-AlN porous body.

In addition, to foam structures, a charge body or a secondary porous body used in any of the systems and methods disclosed herein may include a sintered ceramic powder that is sintered in situ, a previously sintered ceramic powder, a refractory metal baffle, a refractory metal mesh, metal foam, or ceramic foam.

In any of the embodiments explicitly or inherently disclosed, the grown crystals may be doped by introducing a dopant source into the reactor or furnace during the period of crystal growth. The dopant source may be a solid or gaseous source. In one aspect, the crucible may permit the diffusion of gaseous species into the interior of the charge body. In another aspect, solid dopant sources may be mixed in with the charge powder or simply placed in the reactor or furnace with the packed crucible. In addition, the solid dopant sources may be activated thermally or by chemical decomposition.

Those skilled in the art will appreciate that variations from the specific embodiments disclosed above are contemplated by the invention. The invention should not be restricted to the above embodiments, but should be measured by the following claims.

The invention claimed is:

1. A method of growing group III-V nitride crystal comprising:
providing a powder to an annular-shaped cavity of a crucible, the annular shaped cavity defined by an interior surface of the crucible and a packing tube removably disposed in the crucible, and where the powder comprises a distribution of particle sizes of at least one constituent species of the group III-V nitride crystal;
compressing the powder to form a charge body;
removing the packing tube to form a charge body cavity, the charge body comprising an exterior surface and an interior surface defining the charge body cavity;
heating the crucible to sinter the charge body, wherein heating the crucible further induces a driving force across the charge body; and
soaking the crucible and the charge body at a temperature sufficient to diffuse the at least one constituent species of the group III-V nitride crystal from the exterior surface to the interior surface of the charge body, where the at least one constituent species of the group III-V nitride crystal freely-nucleates in the interior surface to grow the group III-V nitride crystal in the interior cavity.

2. The method of claim 1, wherein the group III-V nitride crystal is a single crystal.

3. The method of claim 1, wherein the group III-V nitride crystal comprises nitrogen and at least one species of Al, Ga, and In.

4. The method of claim 3, wherein the group III-V nitride crystal has a formula of $Al_xIn_yGa_{(1-x-y)}N$, where $0 \leq x \leq 1$, $0 \leq y \leq 1$, $x+y+(1-x-y) \neq 1$.

5. The method of claim 2, wherein the single crystal is spontaneously grown on the interior surface of the charge body.

6. The method of claim 1, wherein the at least one constituent species of the group III-V nitride crystal is diffused by a concentration differential.

7. The method of claim 1, wherein a source for the at least one constituent species of the group III-V nitride crystal is provided by thermal decomposition of the charge body.

8. The method of claim 1, wherein the charge body comprises at least one of AlN, $Al_1Ga_{(1-x)}N$, $Al_1In_{(1-x)}N$ where $(0 \leq x \leq 1)$, $Al_xIn_yGa_{(1-x-y)}N$ or a combination thereof.

9. The method of claim 1, wherein the charge body comprises a filler.

10. The method of claim 9, wherein the filler comprises at least one refractory material.

11. The method of claim 10, wherein the at least one refractory metal comprises a carbide of tungsten.

12. The method of claim 9, wherein the filler comprises a complex ceramic material.

13. The method of claim 1, wherein the charge body can be in any shape, with at least one preferable growing surface.

14. The method of claim 1, wherein the charge body comprises a sintered ceramic, wherein the sintered ceramic is sintered in situ from the powder.

15. The method of claim 14, wherein a porosity of the charge body is determined by the distribution of particle sizes of the powder.

16. The method of claim 1, wherein the charge body comprises a solid porous material.

17. The method of claim 16, wherein the solid porous material comprises at least one of a sintered ceramic powder.

18. The method of claim 1, further comprising:
diffusing the at least one constituent species of the group III-V nitride crystal through a second charge body, wherein the second charge body is a solid porous material.

19. The method of claim 18, wherein the charge body is devoid of AlN.

20. The method of claim 1, wherein a growth orientation of the group III-V crystal is controlled by one or more of a direction, a magnitude, or a gradient of the driving force.

* * * * *